US012648247B2

(12) United States Patent
Jeon et al.

(10) Patent No.: US 12,648,247 B2
(45) Date of Patent: Jun. 2, 2026

(54) IMAGE SENSOR COMPRISING FENCE STRUCTURE BETWEEN COLOR FILTERS

(71) Applicant: SAMSUNG ELECTRONICS CO., LTD., Suwon-si (KR)

(72) Inventors: Minhwan Jeon, Hwaseong-si (KR); Chanho Park, Suwon-si (KR); Kyung Rae Byun, Seoul (KR); Chang Kyu Lee, Hwaseong-si (KR); Chongkwang Chang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 970 days.

(21) Appl. No.: 17/866,805

(22) Filed: Jul. 18, 2022

(65) Prior Publication Data

US 2023/0064084 A1 Mar. 2, 2023

(30) Foreign Application Priority Data

Sep. 2, 2021 (KR) ......................... 10-2021-0116977

(51) Int. Cl.
*H10F 39/12* (2025.01)
*H10F 39/00* (2025.01)

(52) U.S. Cl.
CPC ......... *H10F 39/807* (2025.01); *H10F 39/024* (2025.01); *H10F 39/8053* (2025.01); *H10F 39/8063* (2025.01)

(58) Field of Classification Search
CPC ............... H10F 39/024; H10F 39/8053; H10F 39/8063; H10F 39/807
See application file for complete search history.

(56) References Cited

U.S. PATENT DOCUMENTS

| | | | |
|---|---|---|---|
| 9,263,485 | B2 | 2/2016 | Furuta |
| 9,704,901 | B2 | 7/2017 | Lin et al. |
| 10,923,518 | B2 | 2/2021 | Kim et al. |
| 11,322,536 | B2 | 5/2022 | Kim et al. |

(Continued)

FOREIGN PATENT DOCUMENTS

| | | | | |
|---|---|---|---|---|
| KR | 20120001895 A | * | 1/2012 | ............. H10F 39/12 |
| KR | 10-2014-0029933 | | 3/2014 | |

(Continued)

OTHER PUBLICATIONS

Machine Translation: KR 20120001895 (Year: 2012).*

*Primary Examiner* — Yara B Green
*Assistant Examiner* — Christopher M Roland
(74) *Attorney, Agent, or Firm* — Morgan, Lewis & Bockius LLP

(57) ABSTRACT

An image sensor including: a semiconductor substrate including a plurality of pixel regions; an anti-reflection layer on the semiconductor substrate; color filters provided on the anti-reflection layer and in the pixel regions; and a fence structure disposed between adjacent ones of the color filters, wherein the fence structure includes: a lower portion penetrating the anti-reflection layer; an upper portion on the anti-reflection layer; and an intermediate portion between the lower portion and the upper portion, wherein the fence structure has undercut regions, which are provided at both sides of the intermediate portion and are between the upper portion of the fence structure and a top surface of the anti-reflection layer.

20 Claims, 26 Drawing Sheets

(56)　　　　　References Cited

U.S. PATENT DOCUMENTS

| 11,355,541 | B2 | 6/2022 | Lee et al. | |
| 11,670,657 | B2 | 6/2023 | Jeon et al. | |
| 2012/0261782 | A1 | 10/2012 | Kobayashi et al. | |
| 2016/0225815 | A1* | 8/2016 | Um | H10F 39/1515 |
| 2019/0229140 | A1 | 7/2019 | Naito et al. | |
| 2019/0252466 | A1* | 8/2019 | Yoo | H10F 77/331 |
| 2019/0386049 | A1* | 12/2019 | Jung | H10F 39/18 |
| 2020/0083268 | A1* | 3/2020 | Kim | H10F 39/024 |
| 2020/0212095 | A1 | 7/2020 | Kim et al. | |
| 2020/0219920 | A1 | 7/2020 | Hur et al. | |
| 2021/0134874 | A1 | 5/2021 | Park | |
| 2022/0037385 | A1* | 2/2022 | Bang | H10F 39/8057 |
| 2022/0165763 | A1* | 5/2022 | Kim | H10F 39/807 |
| 2022/0375986 | A1* | 11/2022 | Rosenblum | H10F 39/8063 |
| 2023/0282663 | A1* | 9/2023 | Ryu | H10F 39/12 |
| | | | | 257/435 |
| 2024/0234458 | A1* | 7/2024 | Ryu | H10F 39/8063 |

FOREIGN PATENT DOCUMENTS

| KR | 10-2019-0057601 | A | 5/2019 |
| KR | 10-2020-0029098 | A | 3/2020 |
| KR | 10-2020-0082333 | | 7/2020 |
| KR | 10-2020-0087909 | A | 7/2020 |
| KR | 10-2021-0048059 | A | 5/2021 |
| TW | 202127543 | A | 7/2021 |

* cited by examiner

IMAGE SENSOR COMPRISING FENCE STRUCTURE BETWEEN COLOR FILTERS

CROSS-REFERENCE TO RELATED APPLICATION

This U.S. non-provisional patent application claims priority under 35 U.S.C. § 119 to Korean Patent Application No. 10-2021-0116977, filed on Sep. 2, 2021, in the Korean Intellectual Property Office, the disclosure of which is incorporated by reference herein in its entirety.

TECHNICAL FIELD

The present disclosure relates to an image sensor and a method of fabricating the same, and in particular, to an image sensor with improved electrical characteristics and a method of fabricating the same.

DISCUSSION OF RELATED ART

An image sensor is a device that converts optical signals into electrical signals. For example, an image sensor is a sensor that detects and conveys information used to make am image. Currently, there is an increasing demand for high-performance image sensors in a variety of applications such as digital cameras, camcorders, personal communication systems, gaming machines, security cameras, micro-cameras for medical applications, and or robots.

The two main types of electronic image sensors are the charge-coupled device (CCD) and complementary metal-oxide semiconductor (CMOS) image sensors. Both CCD and CMOS sensors are based on MOS technology with CCDs based on MOS capacitors and CMOS sensors are based on MOS field-effect transistor (MOSFET) amplifiers. The CMOS image sensor can be operated in a simplified manner, and since signal-processing circuits of the CMOS image sensor can be integrated on a single chip, it is possible to reduce its size. In addition, since the CMOS image sensor can consume a low amount of power, it can be easily applied to an electronic device with a limited battery capacity. Furthermore, since the CMOS image sensor can be fabricated using existing CMOS fabrication techniques, it is possible to reduce a manufacturing cost thereof. Moreover, as the CMOS image sensor can be made with high resolution, its use is rapidly increasing.

SUMMARY

An embodiment of the inventive concept provides an image sensor with improved electric characteristics and a method of fabricating the same.

According to an embodiment of the inventive concept, an image sensor includes: a semiconductor substrate including a plurality of pixel regions; an anti-reflection layer on the semiconductor substrate; color filters provided on the anti-reflection layer and in the pixel regions; and a fence structure disposed between adjacent ones of the color filters, wherein the fence structure includes, a lower portion penetrating the anti-reflection layer; an upper portion on the anti-reflection layer; and an intermediate portion between the lower portion and the upper portion, wherein the fence structure has undercut regions, which are provided at both sides of the intermediate portion and are between the upper portion of the fence structure and a top surface of the anti-reflection layer.

According to an embodiment of the inventive concept, an image sensor includes, a semiconductor substrate including a plurality of pixel regions; an anti-reflection layer on the semiconductor substrate; color filters provided on the anti-reflection layer and in the pixel regions; and a fence structure disposed between adjacent ones of the color filters, the fence structure including an air gap, wherein the fence structure includes: a first fence pattern provided in the anti-reflection layer to define a lower region of the air gap; barrier patterns provided on a top surface of the anti-reflection layer to cover portions of opposite side surfaces of the first fence pattern; and a second fence pattern provided on the first fence pattern and the barrier patterns to define an upper region of the air gap, wherein the harrier patterns are provided in undercut regions.

According to an embodiment of the inventive concept, an image sensor includes: a semiconductor substrate, which has a first surface and a second surface that are opposite to each other and is of a first conductivity type, the semiconductor substrate including a light-receiving region, a light-blocking region, and a pad region; a pixel isolation structure provided in the light-receiving and light-blocking regions to define a plurality of pixel regions; photoelectric conversion regions provided in the pixel regions; a plurality of micro lenses disposed on the second surface of the semiconductor substrate and provided in the pixel regions; color filters disposed between the micro lenses and the second surface of the semiconductor substrate and provided in the pixel regions; an anti-reflection layer disposed between the color filters and the second surface of the semiconductor substrate; and a fence structure disposed between adjacent ones of the color filters, wherein the fence structure includes: a lower portion penetrating a portion of the anti-reflection layer: an upper portion protruding above the anti-reflection layer; and an intermediate portion between the lower portion and the upper portion, wherein the fence structure has undercut regions, which are provided at both sides of the intermediate portion and are between the upper portion of the fence structure and a top surface of the anti-reflection layer.

According to an embodiment of the inventive concept, a method of fabricating an image sensor includes: forming an anti-reflection layer on a semiconductor substrate including a plurality of pixel regions; sequentially forming a barrier layer and a first fence layer on the anti-reflection layer; forming a trench by patterning the anti-reflection layer, the barrier layer, and the first fence layer; forming a second fence layer to cover a top surface of the first fence layer and an inner surface of the trench; forming a third fence layer on the second fence layer, the third fence layer including an air gap on the trench; and forming a fence structure by patterning the third fence layer, the second fence layer, the first fence layer, and the barrier layer.

BRIEF DESCRIPTION OF THE DRAWINGS

FIG. 3 is a plan view illustrating a portion of an image sensor according to an embodiment of the inventive concept.

FIGS. 8, 9, 10, 11 and 12 are sectional views, which are taken along the line I-I' of FIG. 3 to illustrate a method of fabricating an image sensor, according to an embodiment of the inventive concept.

FIG. 14 is a schematic plan view illustrating an image sensor including a semiconductor device according to an embodiment of the inventive concept.

DETAILED DESCRIPTION OF THE EMBODIMENTS

Example embodiments of the inventive concept will now be described more fully with reference to the accompanying drawings.

Figure 1:
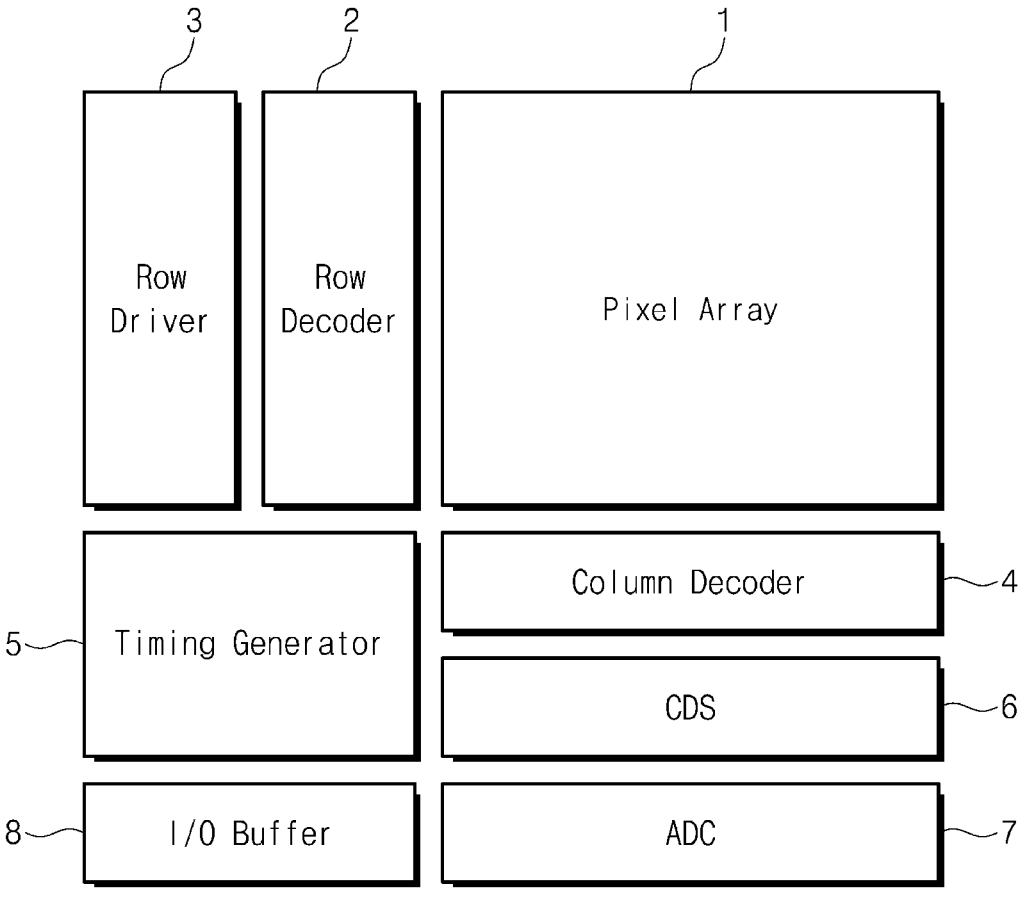
FIG. 1 is a block diagram illustrating an image sensor according to an embodiment of the inventive concept.

FIG. 1 is a block diagram illustrating an image sensor according to an embodiment of the inventive concept.

Referring to FIG. 1, an image sensor may include an active pixel sensor array 1, a row decoder 2, a row driver 3, a column decoder 4, a timing generator 5, a correlated double sampler (CDS) 6, an analog-to-digital converter (ADC) 7, and an input-output (I/O) buffer 8.

The active pixel sensor array 1 may include a plurality of unit pixels that are two-dimensionally arranged to convert optical signals into electrical signals. The active pixel sensor array 1 may be driven by a plurality of driving signals, such as a pixel selection signal, a reset signal, and a charge transmission signal, which are transmitted from the row driver 3. The convened electrical signals may be provided to the CDS 6.

The row driver 3 may be configured to provide the driving signals for driving the plurality of unit pixels to the active pixel sensor array 1, based on a decoding result of the row decoder 2. In the case where the unit pixels are arranged in a matrix shape (e.g., in rows and columns), the driving signals may be provided to respective rows.

The timing generator 5 may be configured to provide timing and control signals to the row decoder 2 and the column decoder 4.

The CDS 6 may be configured to receive the electric signals, which are generated in the active pixel sensor array 1, and to perform a holding and sampling operation on the received electric signals. For example, the CDS 6 may perform a double sampling operation on a specific noise level and a signal level of at least one of the electric signals and may output a difference level corresponding to a difference between the noise and signal levels.

The ADC 7 may be configured to convert analog signals, which correspond to the difference level output from the CDS 6, into digital signals, and then to output the converted digital signals to the I/O buffer 8.

The I/O buffer 8 may be configured to latch the digital signal and to sequentially output the latched digital signals to an image signal processing unit, based on a decoding result of the column decoder 4.

Figure 2A:
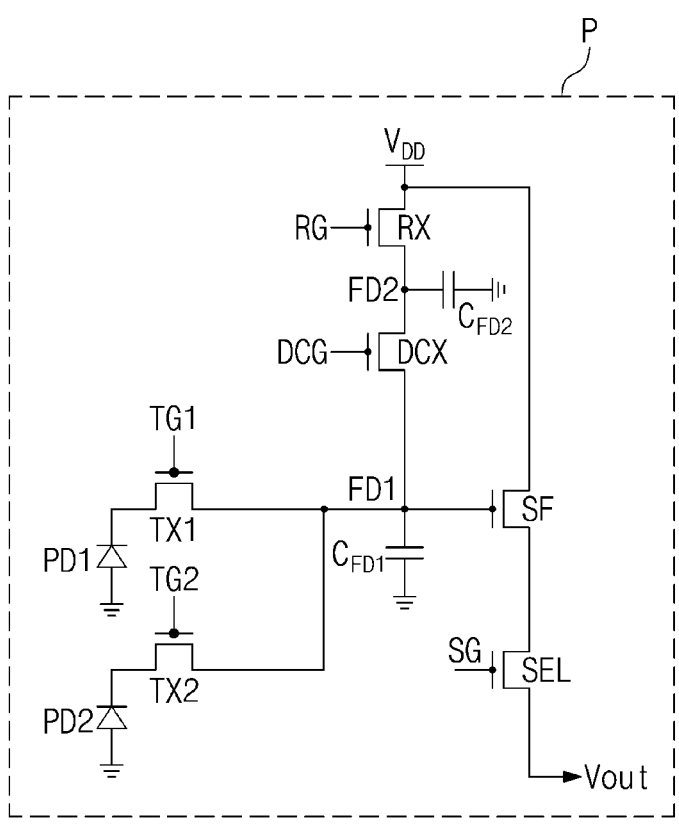
FIGS. 2A and 2B are circuit diagrams illustrating a unit pixel of an image sensor according to an embodiment of the inventive concept.
Figure 2B:
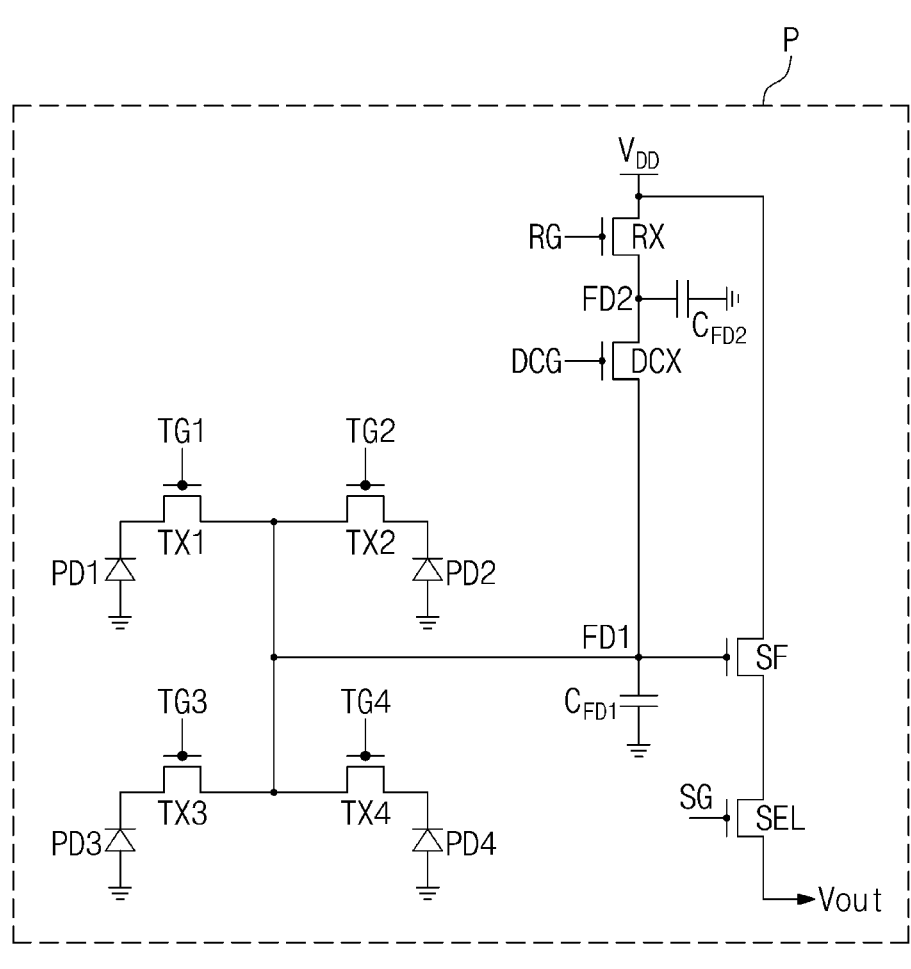

FIGS. 2A and 2B are circuit diagrams illustrating a unit pixel of an image sensor according to an embodiment of the inventive concept.

Referring to FIG. 2A, a unit pixel P may include a plurality of photoelectric conversion devices PD1 and PD2, a plurality of transfer transistors TX1 and TX2, first and second floating diffusion regions FD1 and FD2, and a plurality of pixel transistors.

In an embodiment of the inventive concept, the unit pixel P may include first and second photoelectric conversion devices PD1 and PD2, first and second transfer transistors TX1 and TX2, and the first floating diffusion region FD1, which is connected in common to the first and second transfer transistors TX1 and TX2.

The pixel transistors may include a reset transistor RX, a source follower transistor SF, a selection transistor SEL, and a double conversion gain transistor DCX. FIG. 2A illustrates an example in which each of the unit pixels P includes four pixel transistors, but the inventive concept is not limited to this example. For example, the number of the pixel transistors in each unit pixel P may be variously changed to include more or fewer than four pixel transistors.

The first and second photoelectric conversion devices PD1 and PD2 may be configured to generate electric charges in response to an incident light and to cumulatively store the electric charges. Each of the first and second photoelectric conversion devices PD1 and PD2 may be, for example, a photodiode, a phototransistor, a photo gate, a pinned photodiode (PPD), and combinations thereof.

The first and second transfer transistors TX1 and TX2 may be configured to transfer the electric charges, which are stored in the first and second photoelectric conversion devices PD1 and PD2, to the first floating diffusion region FD1. The first and second transfer transistors TX1 and TX2 may be controlled by first and second transfer signals TG1 and TG2. For example, the first and second transfer signals TG1 and TG2 may be applied to the gates of the first and second transfer transistors TX1 and TX2, respectively. The first and second transfer transistors TX1 and TX2 may share the first floating diffusion region FD1. In other words, the first and second transfer transistors TX1 and TX2 may be connected to the first floating diffusion region FD1.

The first floating diffusion region FD1 may be configured to receive the electric charges, which are generated in the first or second photoelectric conversion device PD1 or PD2, and to cumulatively store the electric charges. The source follower transistor SF may be controlled by an amount of the photocharges stored in the first floating diffusion region FD1.

The reset transistor RX may periodically reset electric charges, which are stored in the first floating diffusion region FD1 and the second floating diffusion region FD2, in response to a reset signal RG applied to a gate electrode of the reset transistor RX. In an embodiment of the double conversion gain transistor DCX, and a source terminal, which is connected to a pixel power voltage VDD. If the reset transistor RX and the double conversion gain transistor DCX are turned on, the pixel power voltage VDD may be applied to the first and second floating diffusion regions FD1 and FD2. Accordingly, the electric charges, which are stored in the first and second floating diffusion regions FD1 and FD2, may be discharged, and as a result, the first and second floating diffusion regions FD1 and FD2 may be reset.

The double conversion gain transistor DCX may be provided between and connected to the first floating diffusion region FD1 and the second floating diffusion region FD2. For example, a first terminal of the double conversion gain transistor DCX may be connected to the second floating diffusion region FD2 and a second terminal of the double conversion gain transistor DCX may be connected to the first floating diffusion region FD1. The double conversion gain transistor DCX may be connected in series to the reset transistor RX through the second floating diffusion region FD2. In other words, the double conversion gain transistor DCX may be provided between and connected to the first floating diffusion region FD1 and the reset transistor RX. The double conversion gain transistor DCX may be configured to change a capacitance CFD1 of the first floating diffusion region FD1 in response to a double conversion gain control signal DCG and thereby to change a conversion gain of the unit pixel P.

For example, during an imaging process, not only a low brightness of light hut also a high brightness of light may be incident into a pixel array or not only a high intensity of light but also a low intensity of light may be incident into the pixel array. Accordingly, a conversion gain in each pixel may vary depending on an incident light. For example, when the double conversion gain transistor DCX is turned off, the unit pixel P may have a first conversion gain, and when the double conversion gain transistor DCX is turned on, the unit pixel P may have a second conversion gain that is higher than the first conversion gain. In other words, depending on the operation of the double conversion gain transistor DCX, the conversion gain in a first conversion gain mode (or a high brightness mode) may have a value different from that in a second conversion gain mode (or a low brightness mode).

When the double conversion gain transistor DCX is turned off, the first floating diffusion region FD1 may have a capacitance corresponding to the first capacitance CFD1. When the double conversion gain transistor DCX is turned on, the first floating diffusion region FD1 may be connected to the second floating diffusion region FD2, and a capacitance of the first and second floating diffusion regions FD1 and FD2 may be a sum of first and second capacitance CFD1 and CFD2. In other words, when the double conversion gain transistor DCX is turned on, the capacitance of the first or second floating diffusion region FD1 or FD2 may be increased to reduce the conversion gain, and when the double conversion gain transistor DCX is turned off, the capacitance of the first floating diffusion region FD1 may be decreased to increase the conversion gain.

The source follower transistor SF may be a source follower butter amplifier, which is configured to generate a source-drain current in proportion to an amount of charges in the first floating diffusion region FD1 to be input to a source follower gate electrode. The source follower transistor SF may amplify a variation in electric potential of the first floating diffusion region FD1 and may output the amplified signal to an output line Vout through the selection transistor SEL. A source terminal of the source follower transistor SF may be connected to the pixel power voltage VDD, and a drain terminal of the source follower transistor SF may be connected to a source terminal of the selection transistor SEL.

The selection transistor SEL may be used to select each row of the unit pixels PX to be read out for a read operation. When the selection transistor SEL is turned on by a selection signal SG applied to a gate electrode of the selection transistor SEL, an electrical signal, which is output through the drain electrode of the source follower transistor SF, may be output to the output line Vout.

Referring to FIG. 2B, the unit pixel P may include first, second, third, and fourth photoelectric conversion devices PD1, PD2, PD3, and PD4, first, second, third, and fourth transfer transistors TX1, TX2, TX3, and TX4, and a first floating diffusion region FD1. Similar to the embodiment of FIG. 2A, the unit pixel P may include four pixel transistors (e.g., RX, DCX, SF, and SEL).

The first to fourth transfer transistors TX1, TX2, TX3, and TX4 may share the first floating diffusion region FD1. Gate electrodes of the first to fourth transfer transistors TX1, TX2, TX3, and TX4 may be controlled by first, second, third and fourth transfer signals TG1, TG2, TG3, and TG4, respectively.

Figure 3:
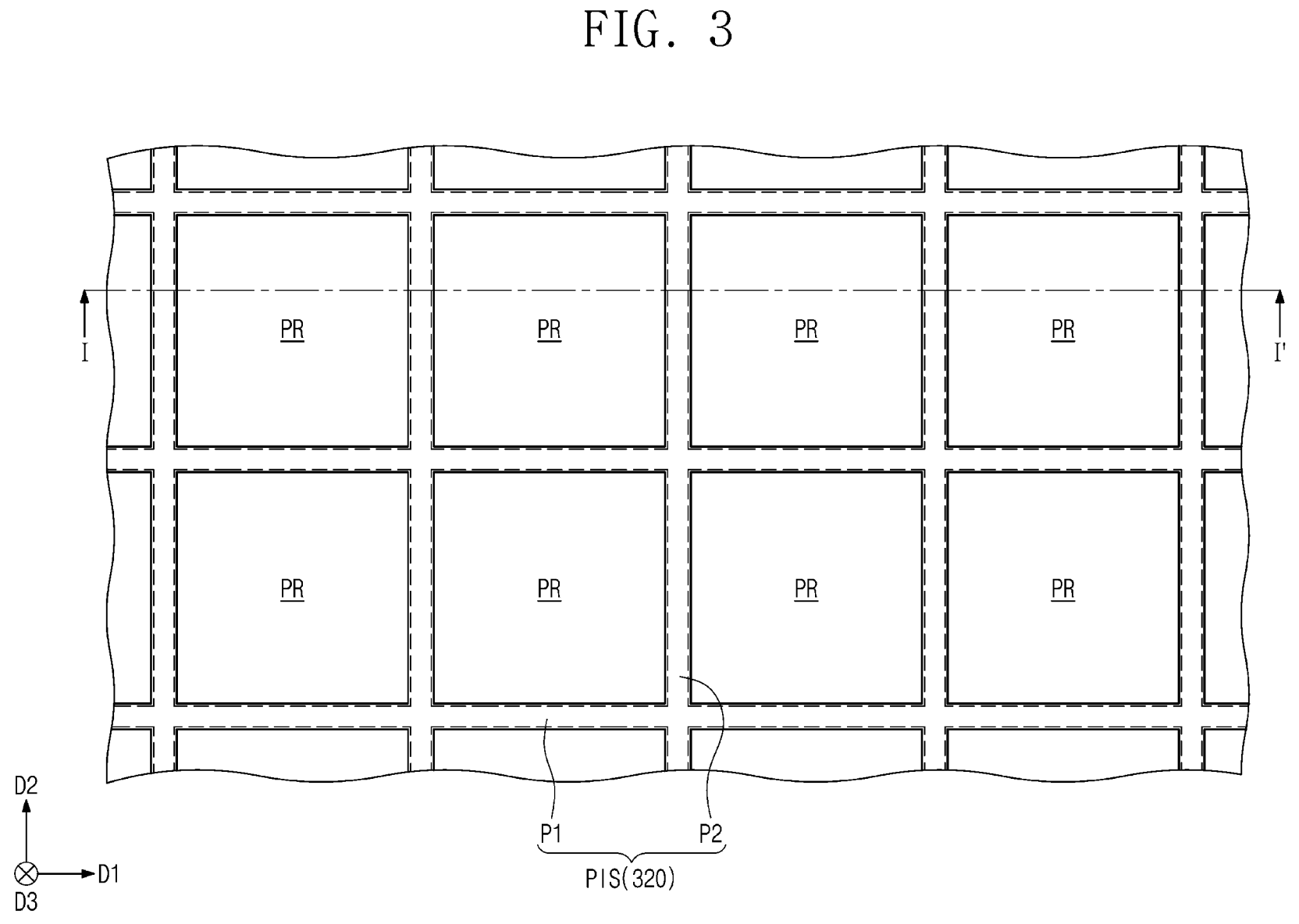
Figure 4:
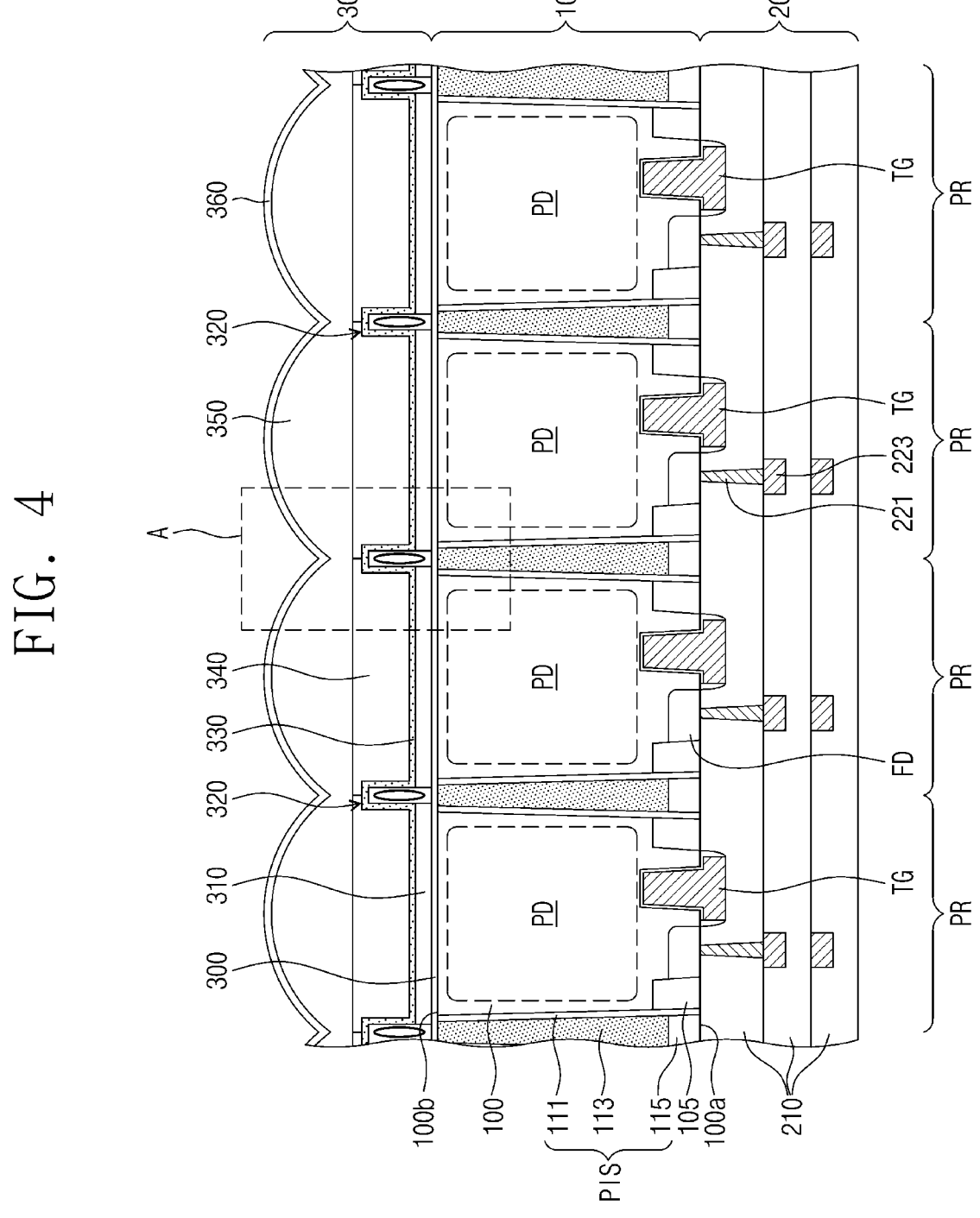
FIG. 4 is a sectional view, which is taken along a line I-I' of FIG. 3 to illustrate an image sensor according to an embodiment of the inventive concept.
Figure 5A:
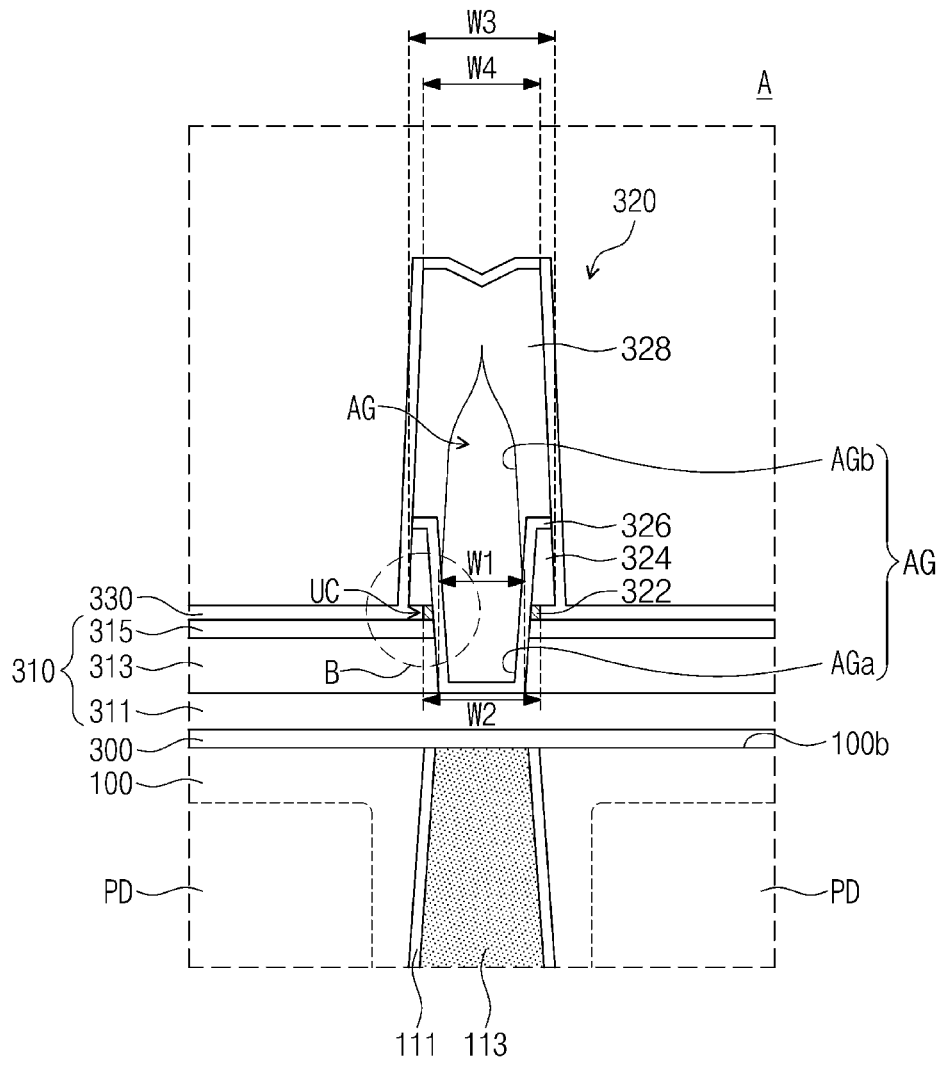
FIG. 5A is an enlarged sectional view illustrating a portion 'A' of FIG. 4.
Figure 5B:
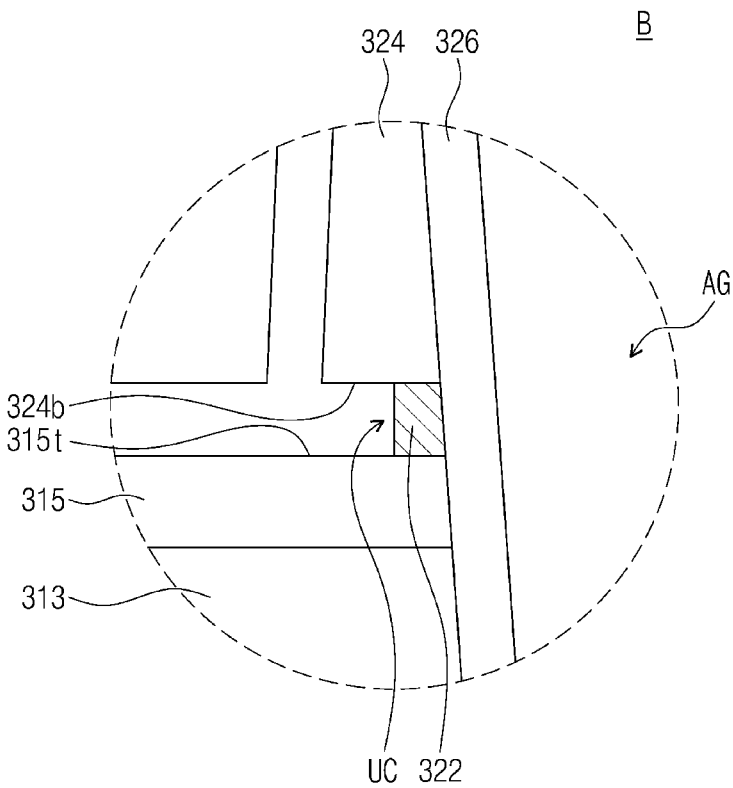
FIG. 5B is an enlarged sectional view illustrating a portion 'B' of FIG. 5A.

FIG. 3 is a plan view illustrating a portion of an image sensor according to an embodiment of the inventive concept. FIG. 4 is a sectional view, which is taken along a line I-I' of FIG. 3 to illustrate an image sensor according to an embodiment of the inventive concept. FIG. 5A is an enlarged sectional view illustrating a portion 'A' of FIG. 4. FIG. 5B is an enlarged sectional view illustrating a portion 'B' of FIG. 5A. FIGS. 6A to 6D are enlarged sectional views, each of which illustrates a portion (e.g., the portion 'A' of FIG. 4) of an image sensor according to an embodiment of the inventive concept.

Referring to FIGS. 3 and 4, an image sensor according to an embodiment of the inventive concept may include a photoelectric conversion layer 10, a readout circuit layer 20, and an optically-transparent layer 30, when viewed in a vertical section view.

The photoelectric conversion layer 10 may be disposed between the readout circuit layer 20 and the optically-transparent layer 30, when viewed in a vertical section view. The photoelectric conversion layer 10 may include a semiconductor substrate 100, a pixel isolation structure PIS, and photoelectric conversion regions PD. Each of the photoelectric conversion regions PD may be configured to convert light, which is incident from the outside, into an electrical signal.

The semiconductor substrate 100 may have a first or top surface 100a and a second or bottom surface 100b which are opposite to each other. The semiconductor substrate 100 may be a substrate including a bulk silicon substrate and an epitaxial layer, which are sequentially stacked and are of a first conductivity type (e.g., p-type). In the case where the bulk silicon substrate is removed during a process of fabricating the image sensor, the semiconductor substrate 100 may be composed of only the p-type epitaxial layer. In an embodiment of the inventive concept, the semiconductor substrate 100 may be a bulk semiconductor substrate, in which a well of the first conductivity type is formed.

In each of pixel regions PR, a device isolation layer 105 may be disposed adjacent to the first surface 100a of the semiconductor substrate 100. The device isolation layer 105 may define an active portion in the semiconductor substrate 100 near the first surface 100a of the semiconductor substrate 100. The device isolation layer 105 may be provided in a device isolation trench, which is formed by recessing the first surface 100a of the semiconductor substrate 100. The device isolation layer 105 may be formed of or include an insulating material.

The pixel isolation structure PIS may be disposed in the semiconductor substrate 100 to define a plurality of the pixel regions PR. In an embodiment of the inventive concept, the pixel regions PR may include first, second and third pixel regions, to which photons of different wavelengths are incident. The first to third pixel regions may be arranged in a first direction D1 and a second direction D2.

The pixel isolation structure PIS may be vertically extended from the first surface 100a of the semiconductor substrate 100 to the second surface 100b of the semiconductor substrate 100. The pixel isolation structure PIS may penetrate a portion of the device isolation layer 105.

The pixel isolation structure PIS may include first portions P1, which are extended in the first direction D1 to be parallel to each other, and second portions P2, which are extended in the second direction D2 to be parallel to each other and to cross the first portions P1. The first portions P1 and the second portions P2 may form a lattice or matrix structure. The pixel isolation structure PIS may be provided to enclose each of the pixel regions PR or each of the photoelectric conversion regions PD, when viewed in a plan view.

The pixel isolation structure PIS may have an upper width at a level of the first surface 100a of the semiconductor substrate 100 and may have a lower width at a level of the bottom surface 100b of the semiconductor substrate 100. The lower width may be substantially equal to or smaller than the upper width. In an embodiment of the inventive concept, the width of the pixel isolation structure PIS may gradually decrease in a direction from the first surface 100a of the semiconductor substrate 100 toward the second surface 100b of the semiconductor substrate 100. In another embodiment of the inventive concept, the width of the pixel isolation structure PIS may gradually decrease in a direction from the second surface 100b of the semiconductor substrate 100 toward the first surface 100a of the semiconductor substrate 100.

The pixel isolation structure PIS may have a length in a direction perpendicular to the top surface of the semiconductor substrate 100 (e.g., in the third direction D3). The length of the pixel isolation structure PIS may be substantially equal to a vertical thickness of the semiconductor substrate 100. The pixel isolation structure PIS may have an aspect ratio of about 10:1 to about 15:1.

The pixel isolation structure PIS may include a liner insulating pattern 111, a semiconductor pattern 113, and a gapfill insulating pattern 115.

The liner insulating pattern 111 may be provided between the semiconductor pattern 113 and the semiconductor substrate 100. The liner insulating pattern 111 may be in direct contact with the semiconductor substrate 100. The liner insulating pattern 111 may extend from the first surface 100a of the semiconductor substrate 100 to the second surface 100b of the semiconductor substrate 100. The liner insulating pattern 111 may be formed of or include a material having a refractive index lower than the semiconductor substrate 100. For example, the liner insulating pattern 111 may be formed of or include at least one of silicon-based insulating materials (e.g., silicon nitride, silicon oxide, and/or silicon oxynitride) and or high-k dielectric materials (e.g., hafnium oxide and/or aluminum oxide). In an embodiment of the inventive concept, the liner insulating pattern 111 may include a plurality of layers which are formed of different materials.

The semiconductor pattern 113 may be formed of or include at least one of crystalline semiconductor materials (e.g., poly silicon). In an embodiment of the inventive concept, the semiconductor pattern 113 may further contain dopants that are of a first or second conductivity type. The semiconductor pattern 113 may be formed of or include at least one of an undoped poly-silicon layer, a doped poly-silicon layer, the air, or combinations thereof.

The gapfill insulating pattern 115 may be disposed on a top surface of the semiconductor pattern 113, and a top surface of the gapfill insulating pattern 115 may be located at substantially the same level as a top surface of the device isolation layer 105. A bottom surface of the gapfill insulating pattern 115 may be located at a level that is lower than or equal to a level of a bottom surface of the device isolation layer 105.

The bottom surface of the gapfill insulating pattern 115 may have a rounded shape. The gapfill insulating pattern 115 may be formed of or include at least one of silicon oxide, silicon oxynitride, or silicon nitride. The gapfill insulating pattern 115 may be in contact with the semiconductor pattern 113, the readout circuit layer 20 and the liner insulating pattern 111.

The photoelectric conversion regions PD may be provided in the pixel regions PR, respectively. The photoelectric conversion regions PD may be formed by injecting impurities, which are of a second conductivity type different from the semiconductor substrate 100, into the semiconductor substrate 100. The semiconductor substrate 100 of the first conductivity type and the photoelectric conversion region PD of the second conductivity type may form a pn junction that is used as a photodiode. The photoelectric conversion regions PD may produce photocharges that are in proportion to an intensity of the incident light.

In an embodiment of the inventive concept, each of the photoelectric conversion regions PD may have a difference in doping concentration between portions adjacent to the first and second surfaces 100a and 100b of the semiconductor substrate 100, thereby having a non-vanishing gradient in potential between the first and second surfaces 100a and 100b of the semiconductor substrate 100. For example, the photoelectric conversion regions PD may include a plurality of impurity regions which are vertically stacked.

The readout circuit layer 20 may be disposed on the first surface 100a of the semiconductor substrate 100. The readout circuit layer 20 may include the pixel transistors (e.g., metal-oxide-semiconductor (MOS) transistors) electrically connected to the photoelectric conversion regions PD. For example, the readout circuit layer 20 may include the reset transistor RX, the selection transistor SEL, the double conversion gain transistor DCX, and the source follower transistor SF previously described with reference to FIGS. 2A and 2B.

In each of the pixel regions PR, transfer gate electrodes TG may be disposed on the first surface 100a of the semiconductor substrate 100. The transfer gate electrode TG may be located at a center portion of each pixel region PR, when viewed in a plan view. A portion of the transfer gate electrode TG may be disposed in the semiconductor substrate 100, and a gate insulating layer may be interposed between the transfer gate electrode TG and the semiconductor substrate 100. The gate insulating layer may be formed of or include at least one of silicon oxide, silicon oxynitride, high-k dielectric materials having dielectric constants higher than silicon oxide, or combinations thereof.

The floating diffusion region FD may be provided in a portion of the semiconductor substrate 100 that is located at one side of the transfer gate electrode TG. For example, the floating diffusion region FD may be located between the transfer gate electrode TG and the device isolation layer 105. The floating diffusion region FD may be formed by injecting impurities into the semiconductor substrate 100 and may have a conductivity type different from that of the semiconductor substrate 100. For example, the floating diffusion region FD may be an n-type impurity region.

At least one pixel transistor may be provided in each of the pixel regions PR to be spaced apart from the transfer gate electrode TG. The pixel transistor provided in each pixel region PR may be one of the reset transistor RX, the source follower transistor SF, the double conversion gain transistor DCX, and the selection transistor SEL described with reference to FIGS. 2A and 2B. The pixel transistor may include a pixel gate electrode and source/drain regions, which are provided in portions of the semiconductor substrate 100 at both sides of the pixel gate electrode.

The transfer gate electrode TG and the pixel gate electrode may be formed of or include at least one of, for example, doped polysilicon, metallic materials, conductive metal nitrides, conductive metal silicide materials, conductive metal oxide materials, or combinations thereof.

Interlayer insulating layers 210 may be provided on the first surface 100a of the semiconductor substrate 100 to cover the transfer gate electrode TG and the pixel gate electrodes.

An interconnection structure 221 and 223, which is connected to readout circuits, may be disposed in the interlayer insulating layers 210. The interconnection structure 221 and 223 may include metal lines 223 and contact plugs 221 connecting them each other.

The optically-transparent layer 30 may be disposed on the second surface 100b of the semiconductor substrate 100. The optically-transparent layer 30 may include a fixed charge layer 300, an anti-reflection layer 310, a fence structure 320, a protection layer 330, color filters 340, micro lenses 350, and a passivation layer 360. The optically-transparent layer 30 may be configured to perform an operation of focusing and filtering light, which is incident from the outside, and to provide the light to the photoelectric conversion layer 10.

The fixed charge layer 300 may be disposed on the second surface 100b of the semiconductor substrate 100. For example, the fixed charge layer 300 may directly contact the second surface 100b of the semiconductor substrate 100. The fixed charge layer 300 may prevent electric charges (e.g., electrons or holes), which are generated by defects that are present on the second surface 100b of the semiconductor substrate 100, from being moved into the photoelectric conversion regions PD. The fixed charge layer 300 may have a single- or multi-layered structure. In an embodiment of the inventive concept, the fixed charge layer 300 may be formed of metal oxide or metal fluoride containing at least one metallic element that is selected from the group consisting of hafnium (Hf), zirconium (Zr), aluminum (Al), tantalum (Ta), titanium (Ti), yttrium (Y) and lanthanum (La). For example, the fixed charge layer 300 may be formed of or include aluminum oxide layer and/or hafnium oxide layer. A thickness of the fixed charge layer 300 may range from about 1 nm to about 50 nm.

The anti-reflection layer 310 may be disposed on the fixed charge layer 300. For example, the anti-reflection layer 310 may directly contact the fixed charge layer 300. The anti-reflection layer 310 may include a first insulating layer 311, a second insulating layer 313, and a third insulating layer 315 which are sequentially stacked. The first to third insulating layers 311, 313, and 315 may be formed of or include at least one of transparent insulating materials. The first to third insulating layers 311, 313, and 315 may have different refractive indices from each other. Thicknesses of the first to third insulating layers 311, 313, and 315 may be variously adjusted to realize high transmittance of the anti-reflection layer 310.

In an embodiment of the inventive concept, live first and third insulating layers 311 and 315 may have the same refractive index, and the second insulating layer 313 may have a refractive index different from the first and third insulating layers 311 and 315. For example, the first and third insulating layers 311 and 315 may be formed of or include at least one of metal oxide materials, and the second insulating layer 313 may be formed of or include silicon oxide.

In an embodiment of the inventive concept, the first insulating layer 311 may be thicker than the fixed charge layer 300. The second insulating layer 313 may be thicker than the first insulating layer 311. The third insulating layer 315 may be thinner than the first and second insulating layers 311 and 313. For example, the first insulating layer 311 may have a thickness of about 600 Å to about 700 Å. The second insulating layer 313 may have a thickness of about 650 Å to about 750 Å. The third insulating layer 315 may have a thickness of about 70 Å to about 150 Å.

The fence structure 320 may be disposed on the anti-reflection layer 310. When viewed in a plan view, the fence structure 320 may have a grid or lattice shape, similar to the pixel isolation structure PIS. The fence structure 320 may be overlapped with the pixel isolation structure PIS, when viewed in a plan view. In other words, the fence structure 320 may include the first portions P1, which are extended in the first direction D1, and the second portions P2, which are extended in the second direction D2 to cross the first portions P1. The fence structure 320 may define openings, which correspond to the pixel regions PR, respectively, on the anti-reflection layer 310. In other words, each opening may be defined by a pair of the first portions P1 and a pair of the second portions P2 of the fence structure 320. Each opening may be overlapped with the photoelectric conversion region PD of the pixel region PR.

The fence structure 320 may be located between the photoelectric conversion regions PD of the pixel regions PR and between adjacent ones of the color filters 340. The smallest width of the fence structure 320 may be substantially equal to or smaller than the smallest width of the pixel isolation structure PIS.

The fence structure 320 may be configured to refract light, which is inclinedly incident through the micro lens 350, and thereby to allow the light to be incident into a corresponding one of the photoelectric conversion regions PD in the pixel region PR. An aspect ratio of the fence structure 320 may range from about 2:1 to about 5:1. A height of the fence structure 320 may range from about 4000 Å to about 7000 Å. A width of the fence structure 320 may range from about 50 nm to about 150 nm.

In an embodiment of the inventive concept, a bottom surface of the fence structure 320 may be located at a level lower than a top surface of the anti-reflection layer 310, and a top surface of the fence structure 320 may be located at a level higher than the top surface of the anti-reflection layer 310. The fence structure 320 may include an air gap AG provided therein. When viewed in a plan view, the air gap AG may be extended in the first direction D1 and the second direction D2, similar to the fence structure 320.

In more detail, referring to FIGS. 5A and 5B, the fence structure 320 may be provided between adjacent ones of the color filters 340 to penetrate at least a portion of the anti-reflection layer 310. The fence structure 320 may be vertically overlapped with the pixel isolation structure PIS. The fence structure 320 may include the air gap AG provided therein. The lowest point of the air gap AG may be located at a level lower than the top surface of the anti-reflection layer 310, and the highest point of the air gap AG may be located at a level higher than the top surface of the anti-reflection layer 310. For example, the lowest point of the air gap AG may be adjacent to the first insulating layer 311.

The fence structure 320 may include a lower portion, which is provided in a trench penetrating a portion of the anti-reflection layer 310, an upper portion, which is provided on the anti-reflection layer 310, and an intermediate portion, which is provided between the lower and upper portions. Here, the fence structure 320 may have undercut regions UC which are located at both sides of the intermediate portion. For example, the upper portion of the fence structure 320 may be vertically spaced apart from the top surface of the anti-reflection layer 310, and as a result, the undercut regions UC may be defined therebetween.

The air gap AG of the fence structure 320 may include a lower gap region AGa, which is formed at a level lower than the top surface of the anti-reflection layer 310, and an upper gap region AGb, which is formed at a level higher than the top surface of the anti-reflection layer 310.

The lower portion of the fence structure 320 may have a first width W1 at a level of its bottom surface and may have an increasing width as the distance to the top surface of the anti-reflection layer 310 decreases. For example, a width of the lower portion of the fence structure 320 may increase closer to the top surface of the anti-reflection layer 310. In other words, the lower portion of the fence structure 320 may have an inclined side surface.

The intermediate portion of the fence structure 320 may have a second width W2 larger than the first width W1. The upper portion of the fence structure 320 may have a gradually decreasing width with increasing distance from the top surface of the anti-reflection layer 310. In other words, a width of the upper portion of the fence structure 320 may decrease farther from the top surface of the anti-reflection layer 310. The fence structure 320 may have a third width W3, which is larger than the second width W2, at a bottom level of the upper portion, and may have a fourth width W4, which is smaller than the third width W3, at a top level of the upper portion.

The fence structure 320 may include barrier patterns 322 on the anti-reflection layer 310, first fence patterns 324 on the barrier patterns 322, a second fence pattern 326 covering an inner surface of a trench penetrating a portion of the anti-reflection layer 310, and a third fence pattern 328 on the second fence pattern 326.

The barrier pattern 322 may be disposed between a bottom surface of the first fence pattern 324 and the top surface of the anti-reflection layer 310 (e.g., the third insulating layer 315). The barrier patterns 322 may be placed at both sides of the second fence pattern 326 and may have side surfaces that are laterally recessed relative to side surfaces of the first and third fence patterns 324 and 328. The barrier patterns 322 may be formed of or include at least one of metallic materials (e.g., titanium, tantalum, or tungsten).

The first fence patterns 324 may be vertically spaced apart from the top surface of the anti-reflection layer 310 to define the undercut regions UC between the bottom surfaces of the first fence patterns 324 and the top surface of the anti-reflection layer 310. The top surface of the anti-reflection layer 310 may correspond to a top surface 315t of the third insulating layer 315. The first fence patterns 324 may partially cover opposite side surfaces of the second fence pattern 326. The first fence patterns 324 may contact opposite side surfaces of the second fence pattern 326.

The second fence pattern 326 may cover the inner surface of the trench, which is formed to penetrate a portion of the anti-reflection layer 310, with a uniform thickness. The second fence pattern 326 may protrude above the top surface of the anti-reflection layer 310, while having the uniform thickness. The second fence pattern 326 may define the lower gap region AGa in the trench of the anti-reflection layer 310.

A portion of the second fence pattern 326 may be disposed on a top surface of the first fence patient 324. In other words, an uppermost portion of the second fence pattern 326 may overlap the top surface of the first fence pattern 324. A bottom surface of the second fence pattern 326 may be in contact with a top surface of the first insulating layer 311. Alternatively, the bottom surface of the second fence pattern 326 may be in contact with the fixed charge layer 300.

The third fence pattern 328 may define the upper gap region AGb on the second fence pattern 326. The upper gap region AGb may be connected to the lower gap region AGa. The third fence pattern 328 may have a gradually decreasing width in an upward direction. The third fence pattern 328 may have an inclined side surface. A top surface of the third fence pattern 328 (e.g., the top surface of the fence structure 320) may not be flat. For example, the top surface of the third fence pattern 328 may be protruded downwards.

In an embodiment of the inventive concept, the lower portion of the fence structure 320 may include a lower portion of the second fence pattern 326, the intermediate portion of the fence structure 320 may include portions of the second fence pattern 326 and the barrier patterns 322, and the upper portion of the fence structure 320 may include the first, second, and third fence patterns 324, 326, and 328.

The first, second, and third fence patterns 324, 326, and 328 may be formed of the same insulating material, and in this case, there may be no observable interface between the first, second, and third fence patterns 324, 326, and 328. The first, second, and third fence patterns 324, 326, and 328 may be formed of or include at least one of silicon oxide, silicon nitride, and/or silicon oxynitride. The first, second, and third fence patterns 324, 326, and 328 may be formed of or include a silicon oxide material (e.g., tetraethyl orthosilicate (TEOS)).

In the embodiment of FIGS. 5A and 5B, the undercut region UC of the fence structure 320 may be defined by a bottom surface 324b of the first fence pattern 324, the top surface 315t of the anti-reflection layer 310 (e.g., the third insulating layer 315), and a side surface of the barrier pattern 322.

In an embodiment of the inventive concept, since the fence structure 320 includes the air gap AG, an inclinedly incident light may be less refracted by the fence structure 320, and thus, it is possible to increase an amount of light that is incident into the photoelectric conversion region PD.

Since a portion of the air gap AG of the fence structure 320 is located below the top surface of the anti-reflection layer 310, it is possible to reduce a cross-talk issue between adjacent ones of the pixel regions PR. In other words, in each of the photoelectric conversion regions PD, the light-receiving efficiency may be increased and the signal-to-noise ratio (SNR) property may be improved.

By reducing a size of the barrier pattern 322, which may be present on a portion of side surface of the fence structure 320, it is possible to minimize a reduction of sensitivity caused by the barrier patterns 322.

Figure 6A:
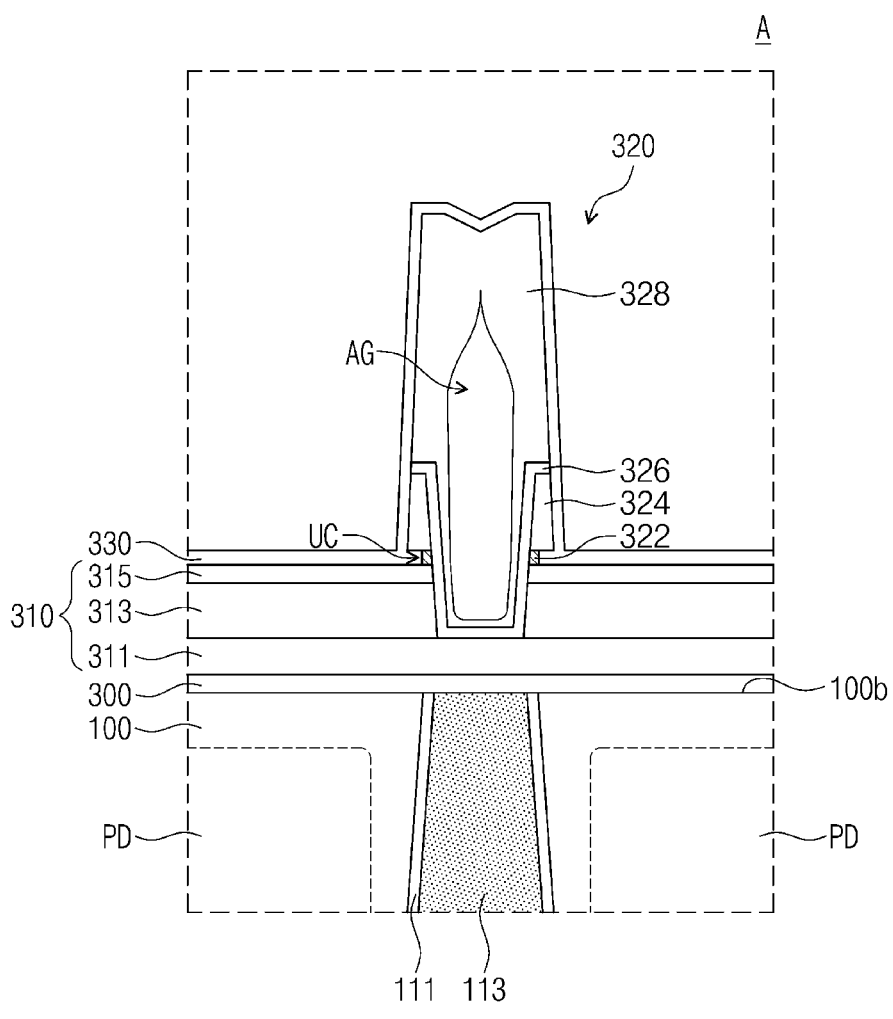
FIGS. 6A, 6B, 6C and 6D are enlarged sectional views, each of which illustrates a portion (e.g., the portion A of FIG. 4) of an image sensor according to an embodiment of the inventive concept.

In the embodiment of FIG. 6A, the third fence pattern 328 of the fence structure 320 may cover a portion of the lower gap region AGa of the second fence pattern 326, and thus, the fence structure 320 may include the air gap AG that is enclosed by the third fence pattern 328. In other words, the entirety of the air gap AG of the fence structure 320 (e.g., both of the lower and upper gap regions AGa and AGb provided below and above the top surface of the anti-reflection layer 310) may be defined by the third fence pattern 328. For example, the air gap AG may be surrounded by the third fence pattern 328.

Figure 6B:
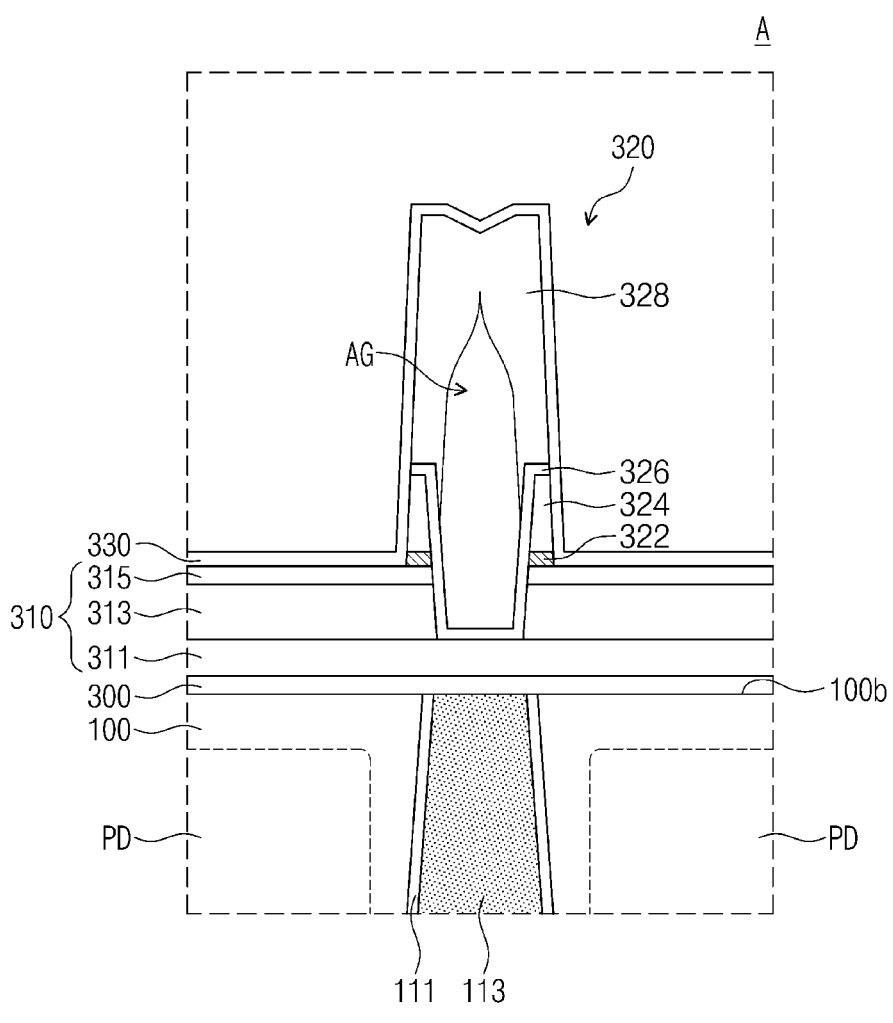

In the fence structure 320 according to the embodiment of FIG. 6B, the barrier patterns 322 and the first fence patterns 324 may be provided to have side surfaces that are aligned to each other, without the undercut region UC. In this case, the intermediate portion of the fence structure 320 may have the largest width.

Figure 6C:
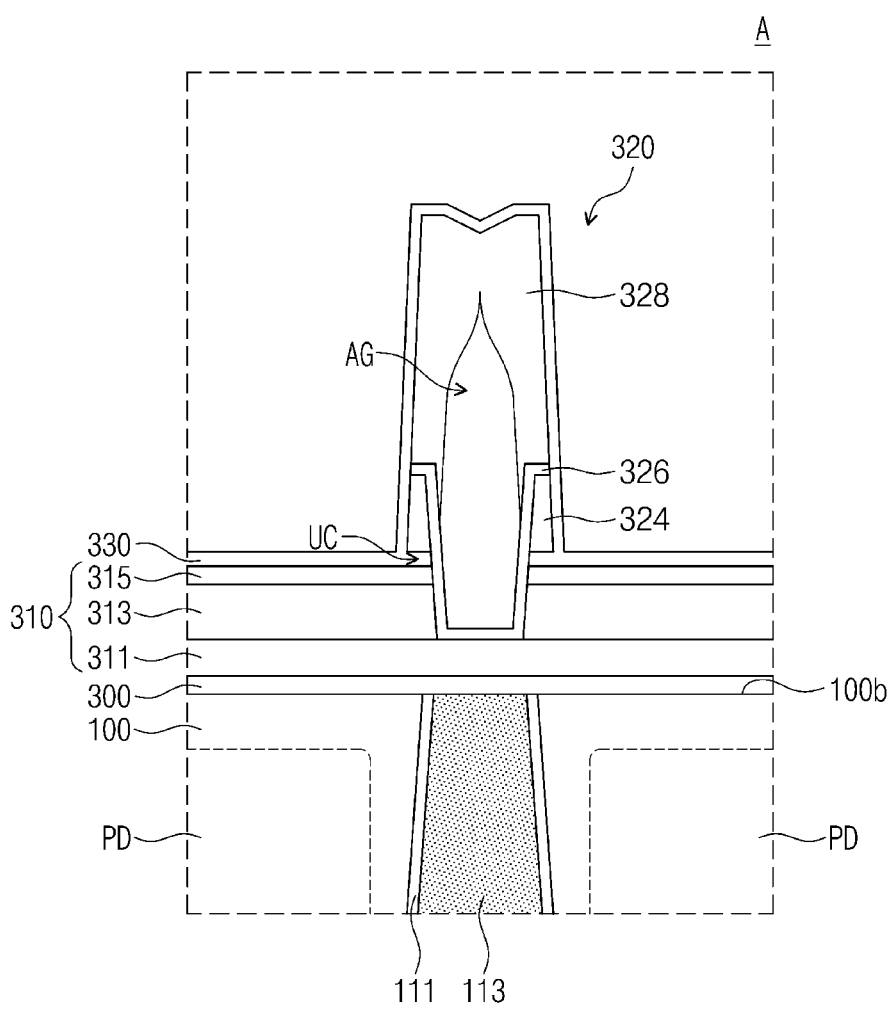

In the embodiment of FIG. 6C, the barrier patterns 322 of FIG. 5A may be omitted from the fence structure 320. In other words, the undercut region UC may be defined by the opposite side surfaces of the second fence patient 326, the bottom surfaces of the first fence patterns 324, and the top surface of the anti-re fleet ion layer 310 (e.g., the third insulating layer 315). In addition, the undercut regions UC of the fence structure 320 may be asymmetrically formed at both sides of the second fence pattern 326.

Figure 6D:
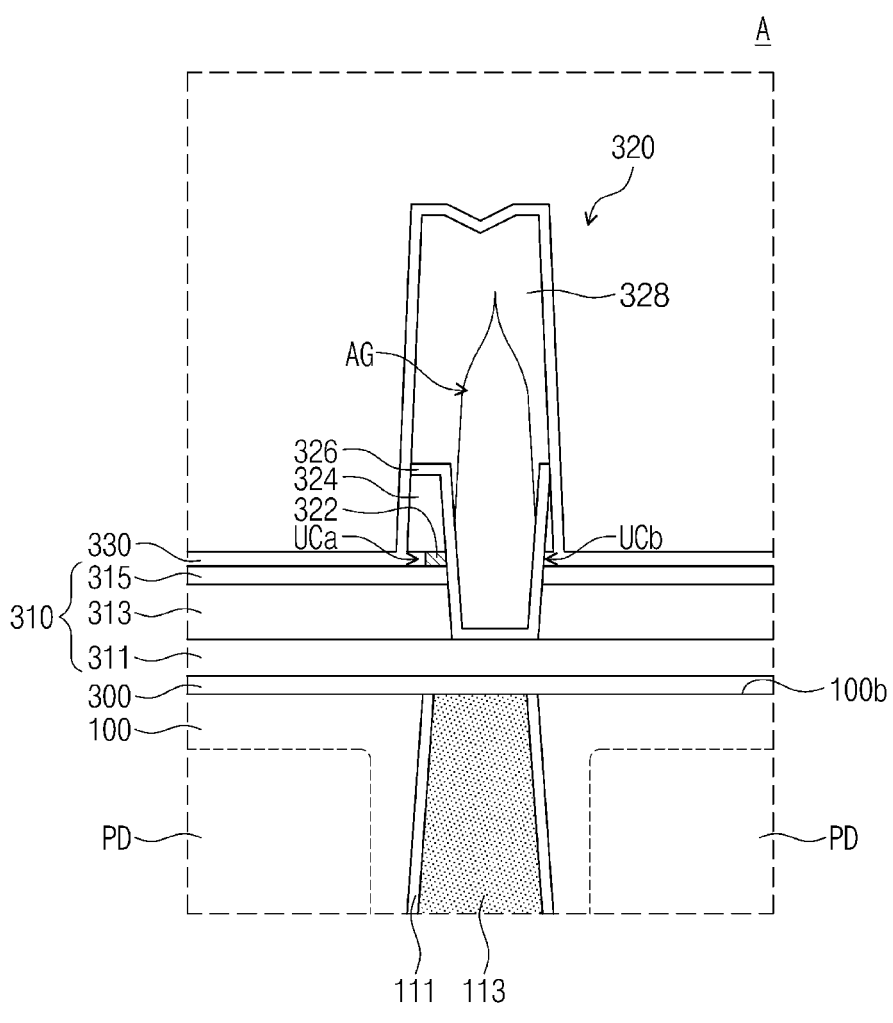

In the embodiment of FIG. 6D, the undercut regions UC may be asymmetrically provided on opposite side surfaces of the fence structure 320. For example, the barrier pattern 322 may be located on a first side surface of the second fence pattern 326 and may not be located on a second side surface of the second fence pattern 326. The second side surface of the second fence pattern 326 may be opposite the first side surface of the second fence pattern 326. Thus, the undercut regions UC may include a first undercut region UCa, which is defined by the top surface of the anti-reflection layer 310, the bottom surface of one of the first fence patterns 324, and the side surface of the barrier pattern 322, and a second undercut region UCb, which is defined by the top surface of the anti-reflection layer 310, the bottom surface of another of the first fence patterns 324, and the second side surface of the second fence pattern 326.

Referring back to FIGS. 3 and 4, the protection layer 530 may be provided on the anti-reflection layer 310 to cover the fence structure 320 with a substantially uniform thickness. In other words, the protection layer 330 may be provided to cover the top and side surfaces of the fence structure 320 with a substantially uniform thickness. The protection layer 330 may be interposed between a side surface of the color filter 340 and a side surface of the fence structure 320 and may be extended to a region between a bottom surface of the color filter 340 and the anti-reflection layer 310.

The protection layer 330 may have a single- or multi-layered structure including at least one of an aluminum oxide layer and a silicon carbon oxide layer. The protection layer 330 may have a thickness of about 50 Å to about 150 Å.

The color filters 340 may be formed to correspond to the pixel regions PR, respectively. Each of the color filters 340 may fill a space defined by the fence structure 320. The color filters 340 may include red, green, or blue filters or magenta, cyan, or yellow filters, according to positions or kinds of the unit pixels.

The color filters 340 may include three or four kinds of color filters. As an example, first to third color filters may be provided in the first to third pixel regions, respectively. The first to third color filters may include red, green, and blue filters. Alternatively, the first to third color filters may include magenta (Mg), yellow (Y), and cyan (Cy) filters.

The micro lenses 350 may be disposed on the color filters 340. The micro lenses 350 may have a convex shape and may have a specific curvature radius. The micro lenses 350 may be formed of or include an optically transparent resin.

The passivation layer 360 may be formed to conformally cover the surfaces of the micro lenses 350. The passivation layer 360 may be formed of or include at least one of, for example, inorganic oxide materials.

Figure 7A:
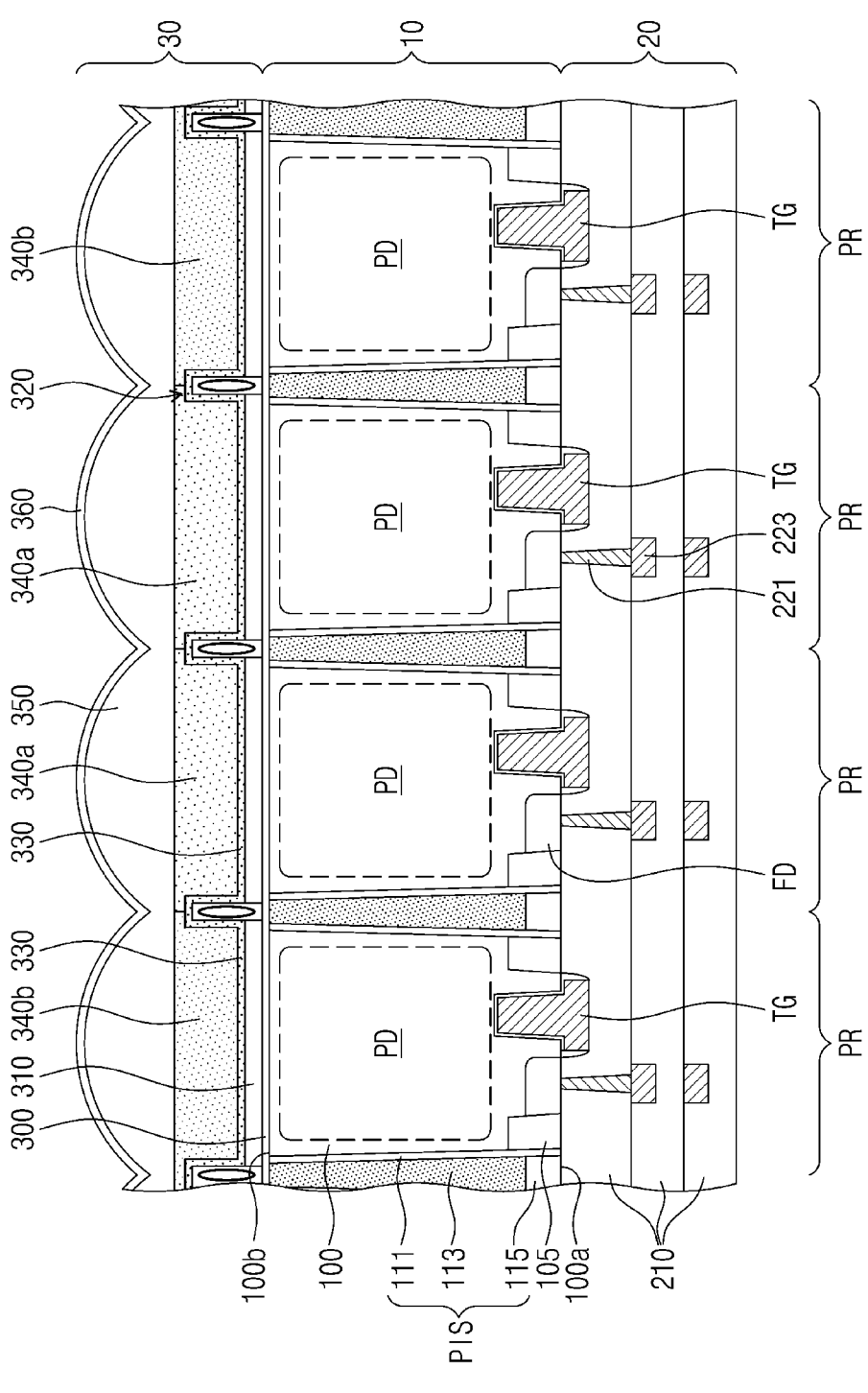
FIGS. 7A and 7B are sectional views, each of which illustrates an image sensor according to an embodiment of the inventive concept.
Figure 7B:
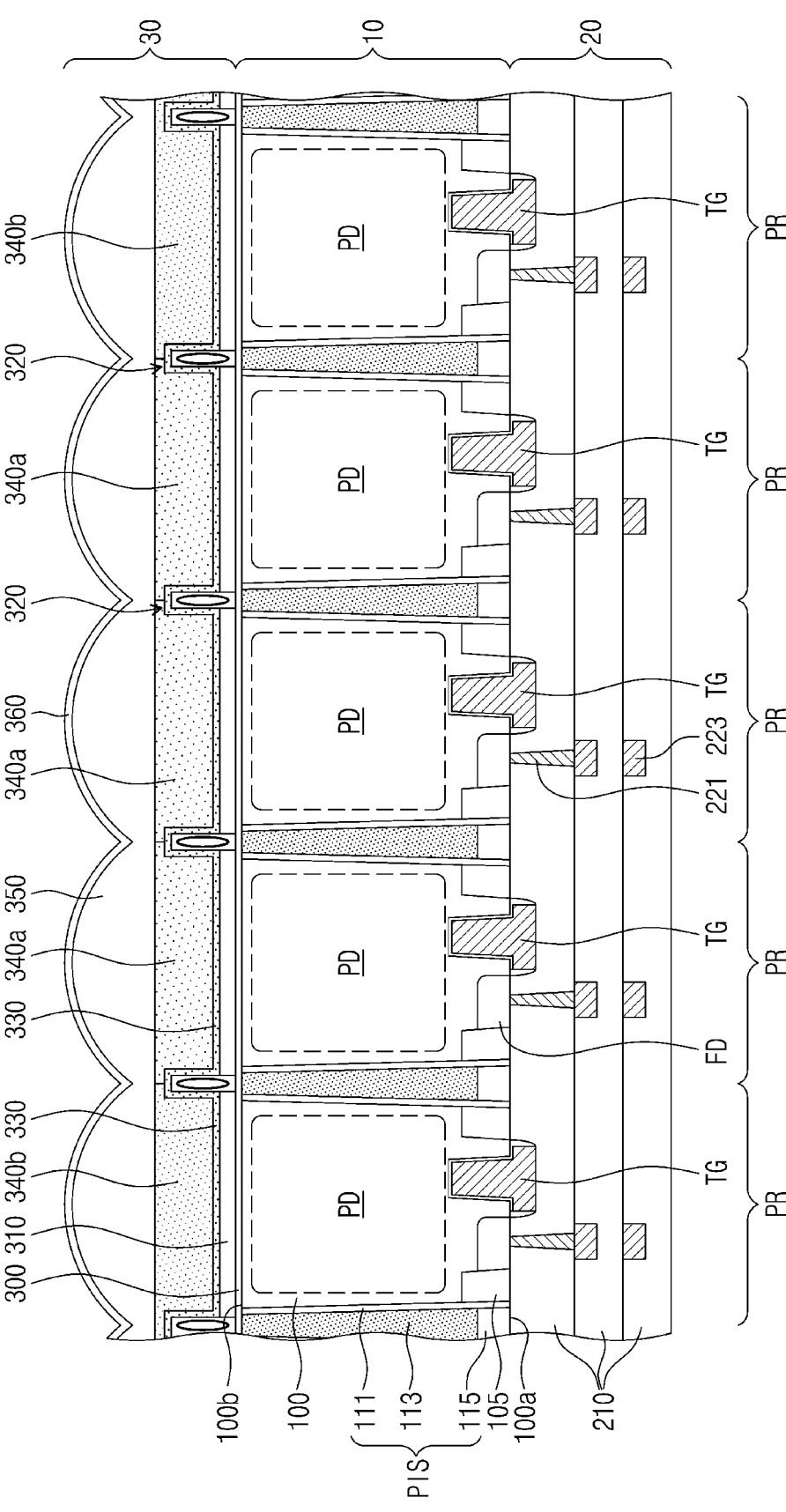

FIGS. 7A and 7B are sectional views, each of which illustrates an image sensor according to an embodiment of the inventive concept. For concise description, a previously-described element may be identified by the same reference number without repeating an overlapping description thereof.

Referring to FIG. 7A, color filters 340a and 340b may be provided to correspond to the pixel regions PR, respectively, and in an embodiment of the inventive concept, at least two first color filters 340a may be disposed between adjacent ones of the second color filters 340b.

For example, the fence structure 320 may be disposed between adjacent ones of the first and second color filters 340a and 340b, between adjacent ones of the first color filters 340a, and between adjacent ones of the second color filters 340b. In other words, the fence structure 320 may be provided between the color filters (e.g., 340a or 340b) of the same color and between the color filters 340a and 340b of different colors.

Referring to FIG. 7B, at least three first color filters 340a may be disposed between adjacent ones of the second color filters 340b. In addition, the fence structure 320 may be provided between the color filters (e.g., 340a or 340b) of the same color and between the color filters 340a and 340b of different colors, as described above.

FIGS. 8 to 12 are sectional views, which are taken along the line I-I' of FIG. 3 to illustrate a method of fabricating an image sensor, according to an embodiment of the inventive concept. FIGS. 13A to 13E are sectional views corresponding to illustrating the portion 'A' of FIG. 4 and illustrating a method of forming a fence structure of an image sensor, according to an embodiment of the inventive concept.

Figure 8:
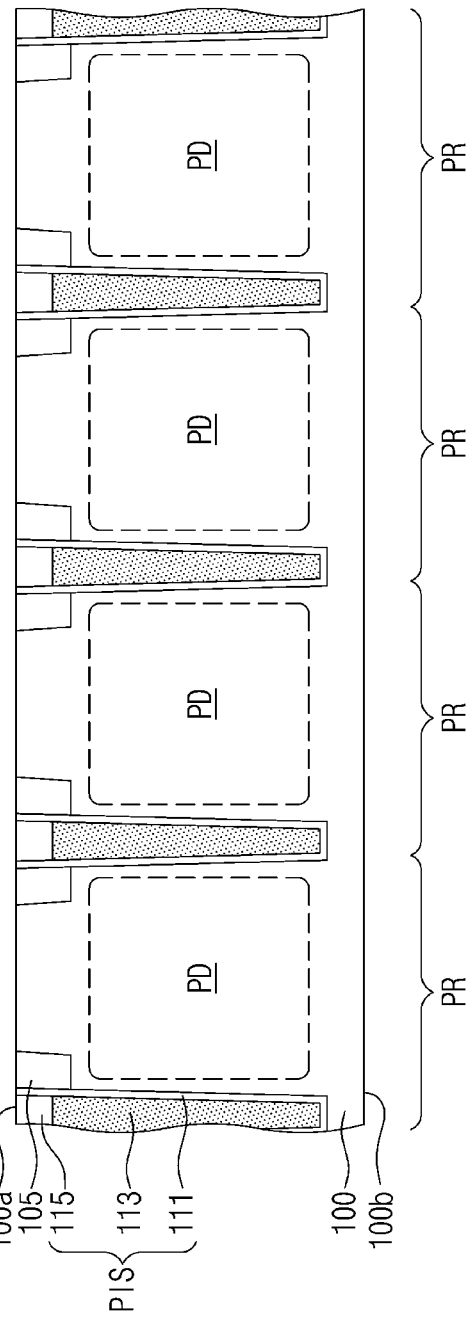

Referring to FIGS. 3 and 8, the semiconductor substrate 100 of the first conductivity type (e.g., p-type) may be provided. The semiconductor substrate 100 may have the first surface 100a and the second surface 100b, which are opposite to each other.

The semiconductor substrate 100 may include a bulk silicon substrate of a first conductivity type and an epitaxial layer, which is formed on the bulk silicon substrate and is of the first conductivity type. Here, the epitaxial layer may be formed by a selective epitaxial growth (SEG) process using the bulk silicon substrate as a seed, and the epitaxial layer may be doped with impurities of the first conductivity type, during the epitaxial growth process. For example, the epitaxial layer may contain p-type impurities.

In an embodiment of the inventive concept, the semiconductor substrate 100 may be a bulk semiconductor substrate including a well of the first conductivity type. In an embodiment of the inventive concept, the semiconductor substrate 100 may be a silicon-on-insulator (SOI) substrate, a germanium substrate, a germanium-on-insulator (GOI) substrate, or a silicon-germanium substrate.

In each pixel region PR, the device isolation layer 105 may be formed near the first surface 100a of the semiconductor substrate 100 to define active portions in the semiconductor substrate 100. The formation of the device isolation layer 105 may include patterning the first surface 100a of the semiconductor substrate 100 to form a shallow trench and depositing an insulating material to fill the shallow trench. The formation of the device isolation layer 105 may be performed before or after the formation of the photoelectric conversion regions PD.

The pixel isolation structure PIS may be formed to define the pixel regions PR in the semiconductor substrate 100. The formation of the pixel isolation structure PIS may include patterning the first surface 100a of the semiconductor substrate 100 to form a deep trench, forming a liner insulating layer to conformally cover an inner surface of the deep trench, depositing a semiconductor layer to fill the deep trench covered with the liner insulating layer, and planarizing the liner insulating layer and the semiconductor pattern 113 to expose the first surface 100a of the semiconductor substrate 100 and to form the liner insulating pattern 111, the semiconductor pattern 113, and the gapfill insulating pattern 115 in the deep trench. The liner insulating pattern 111 and the gapfill insulating pattern 115 may be formed of or include at least one of silicon oxide, silicon nitride, and/or silicon oxynitride. The semiconductor pattern 113 may include a doped poly-silicon layer and/or an undoped poly-silicon layer.

Thereafter, the photoelectric conversion regions PD of the second conductivity type may be formed in the semiconductor substrate 100.

The photoelectric conversion regions PD may be formed by injecting impurities, which are of the second conductivity type (e.g., n-type) different from the first conductivity type, into the semiconductor substrate 100. The photoelectric conversion regions PD may be spaced apart from the first and second surfaces 100a and 100b of the semiconductor substrate 100.

An example in which the photoelectric conversion regions PD are formed after the formation of the pixel isolation structure PIS has been described, but in an embodiment of the inventive concept, the photoelectric conversion regions PD may be formed before the formation of the pixel isolation structure PIS.

Figure 9:
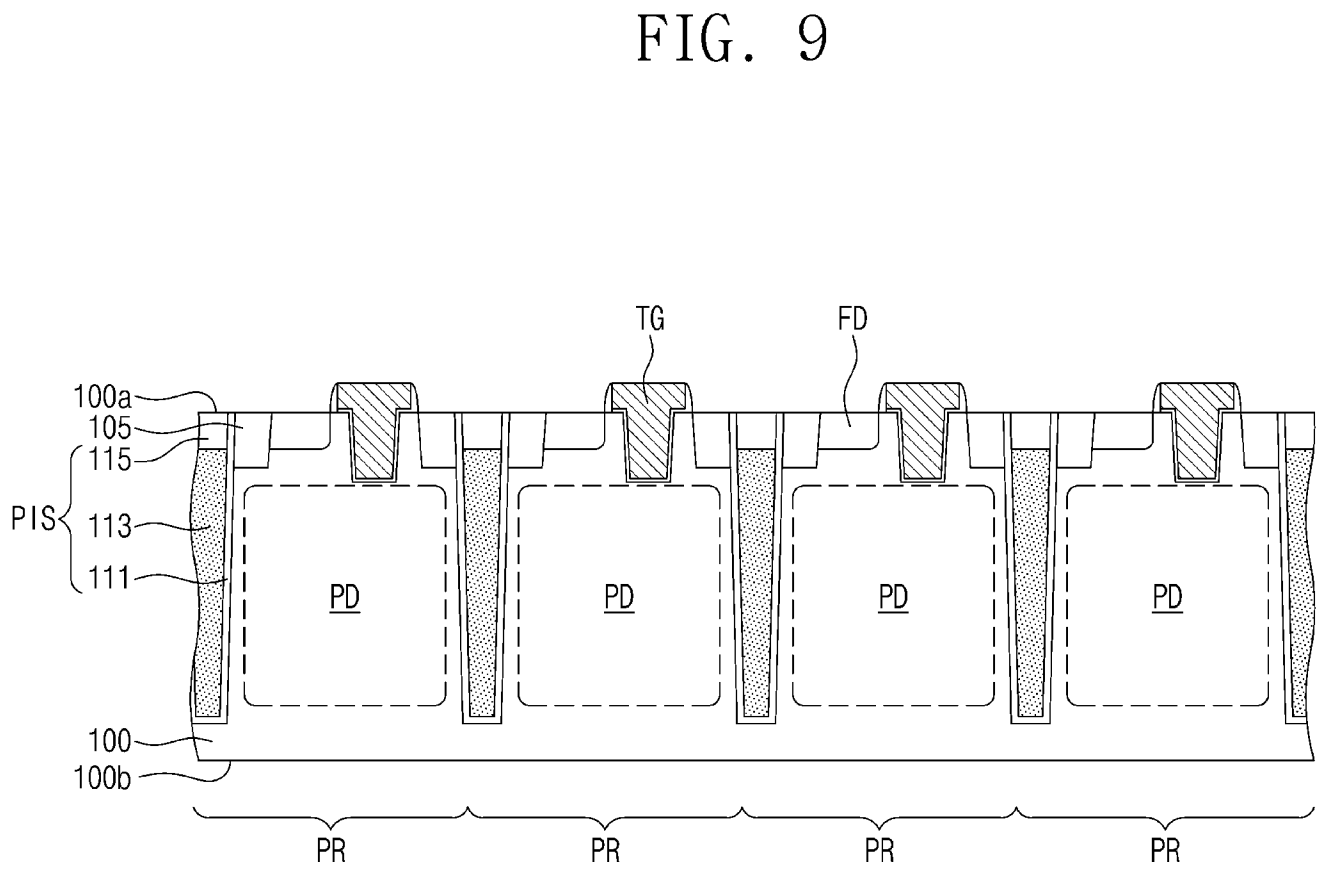

Referring to FIGS. 3 and 9, the transfer transistors and the pixel transistors may be formed on the first surface 100a of the semiconductor substrate 100.

For example, the transfer gate electrodes TG may be formed in the pixel regions PR, respectively. The formation of the transfer gate electrodes TG may include patterning the semiconductor substrate 100 to form a gate recess region in each of the pixel regions PR, forming a gate insulating layer to conformally cover an inner surface of the gate recess region, forming a gate conductive layer to fill the gate recess region, and patterning the gate conductive layer.

In addition, the gate electrodes of the pixel transistors may also be formed in each of the pixel regions PR, when the transfer gate electrodes TG are formed by patterning the gate conductive layer.

The floating diffusion regions FD may be formed in portions of the semiconductor substrate 100, each of which is located at a side of the transfer gate electrode TG, after the formation of the transfer gate electrodes TG. The floating diffusion regions FD may be formed by injecting impurities, which are of the second conductivity type, into the semiconductor substrate 100. In addition, the source/drain impurity regions of the pixel transistors may be formed, when the floating diffusion regions FD are formed.

Figure 10:
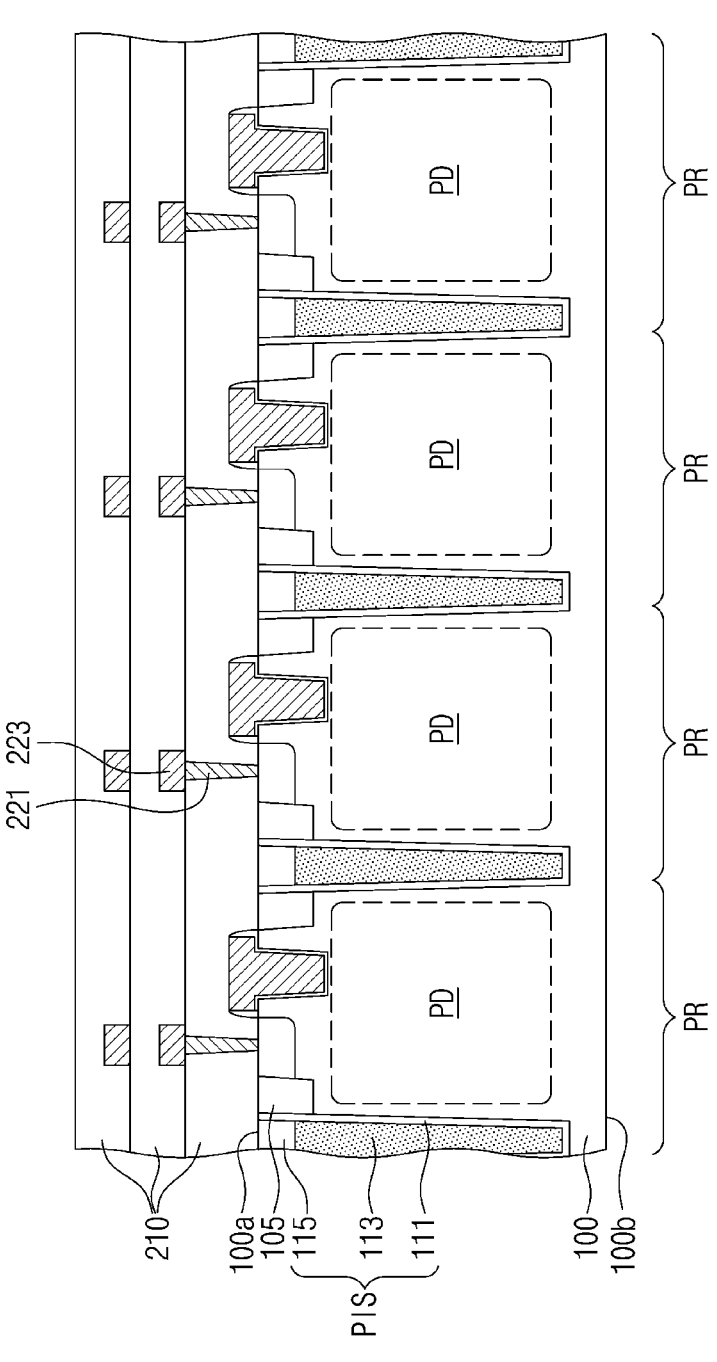

Referring to FIG. 10, the interlayer insulating layers 210 and the interconnection structure 221 and 223 may be formed on the first surface 100a of the semiconductor substrate 100.

The interlayer insulating layers 210 may be formed to cover the transfer and logic transistors. The interlayer insulating layers 210 may be formed of a material having a good gap-filling property and may have a substantially flat top surface.

The contact plugs 221, which are connected to the floating diffusion region FD or the readout transistors, may be formed in the interlayer insulating layers 210. The metal lines 223 may be formed between the interlayer insulating layers 210. The contact plugs 221 and the metal lines 223 may be formed of or include at least one of, for example, copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (WN), and alloys thereof.

Figure 11:
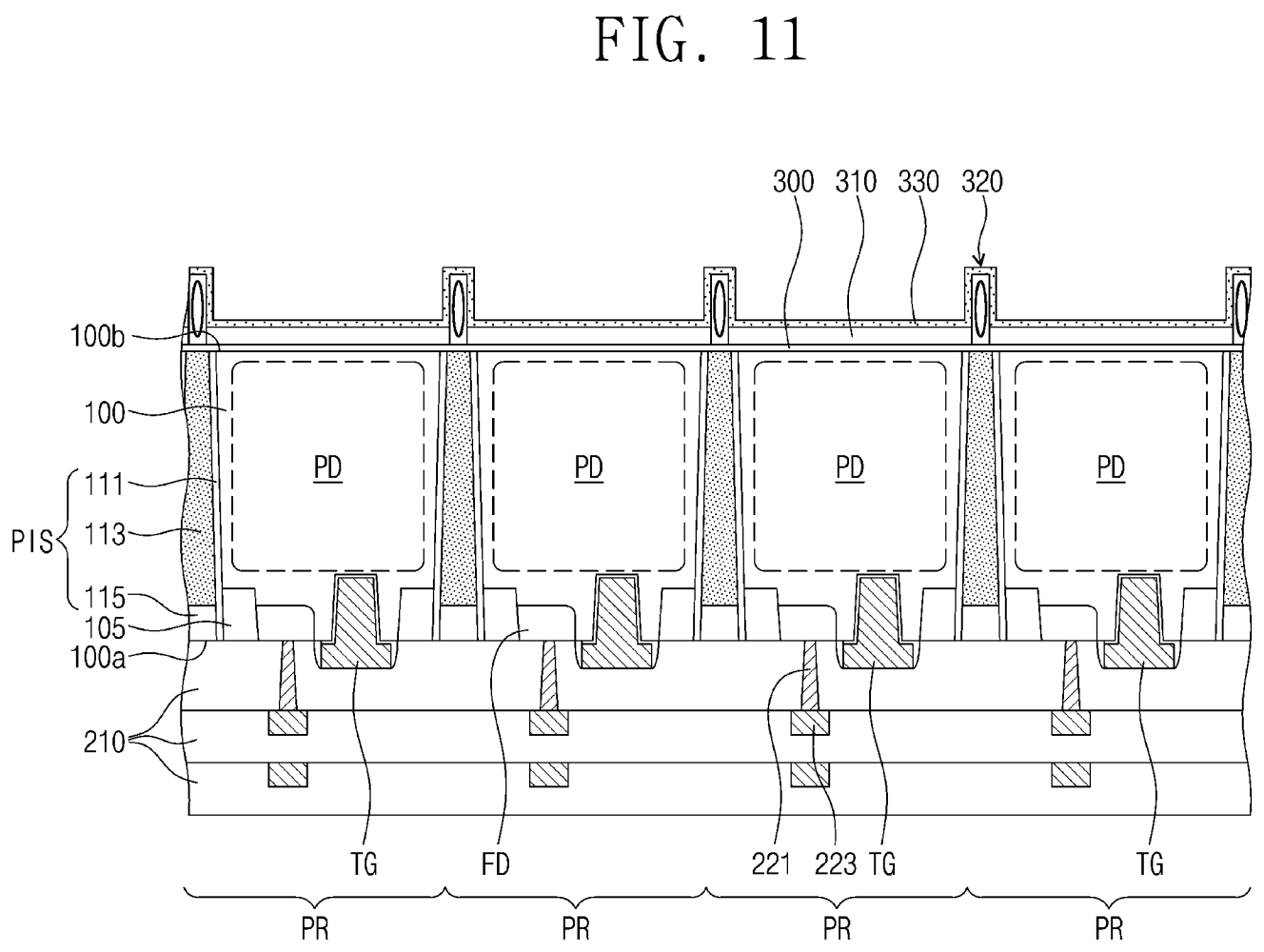

Referring to FIG. 11, a thinning process of removing a portion of the semiconductor substrate 100 may be performed to reduce a vertical thickness of the semiconductor substrate 100. The thinning process may include grinding or polishing the second surface 100b of the semiconductor substrate 100 and performing an anisotropic or isotropic etching process. The semiconductor substrate 100 may be inverted, for the thinning process.

As an example, a grinding or polishing process may be performed to remove the bulk silicon substrate of the semiconductor substrate 100 and to expose the epitaxial layer of the semiconductor substrate 100. Thereafter, an anisotropic or isotropic etching process may be performed to remove surface defects, which may exist on the exposed surface of the epitaxial layer. The exposed surface of the epitaxial layer may correspond to the second surface 100b of the semiconductor substrate 100.

The thinning process on the semiconductor substrate 100 may be performed to expose the semiconductor pattern 113 of the pixel isolation structure PIS near the second surface 100b of the semiconductor substrate 100. As a result, the semiconductor pattern 113 and the liner insulating pattern 111 may have surfaces that are located at substantially the same level as the second surface 100b of the semiconductor substrate 100.

Next, referring to FIG. 11, the fixed charge layer 300 may be formed on the second surface 100b of the semiconductor substrate 100, to which the thinning process is performed. The fixed charge layer 300 may be formed to directly cover the second surface 100b of the semiconductor substrate 100. In other words, the fixed charge layer 300 may directly contact the second surface 100b of the semiconductor substrate 100. The fixed charge layer 300 may be formed by depositing a metal oxide material (e.g., aluminum oxide and or hafnium oxide). The fixed charge layer 300 may be formed to have a thickness of about 1 nm to about 50 nm.

The anti-reflection layer 310 may be formed on the fixed charge layer 300. For example, the anti-reflection layer 310 may directly contact the fixed charge layer 300. The anti-reflection layer 310 may include a plurality of insulating layers.

After the formation of the anti-reflection layer 310, the fence structure 320 including the air gap AG may be formed. As described above, the fence structure 320 may be overlapped with the pixel isolation structure PIS in the semiconductor substrate 100, when viewed in a plan view. The method of forming the fence structure 320 will be described in more detail with reference to FIGS. 13A to 13B.

Next, the protection layer 330 may be formed to conformally cover an exposed surface of the fence structure 320 and a top surface of the anti-reflection layer 310, which is exposed by the fence structure 320. The protection layer 330 may be formed by a chemical vapor deposition process or an atomic layer deposition process. The protection layer 330 may be formed to have a single- or multi-layered structure including at least one of aluminum oxide and silicon carbon oxide.

Figure 12:
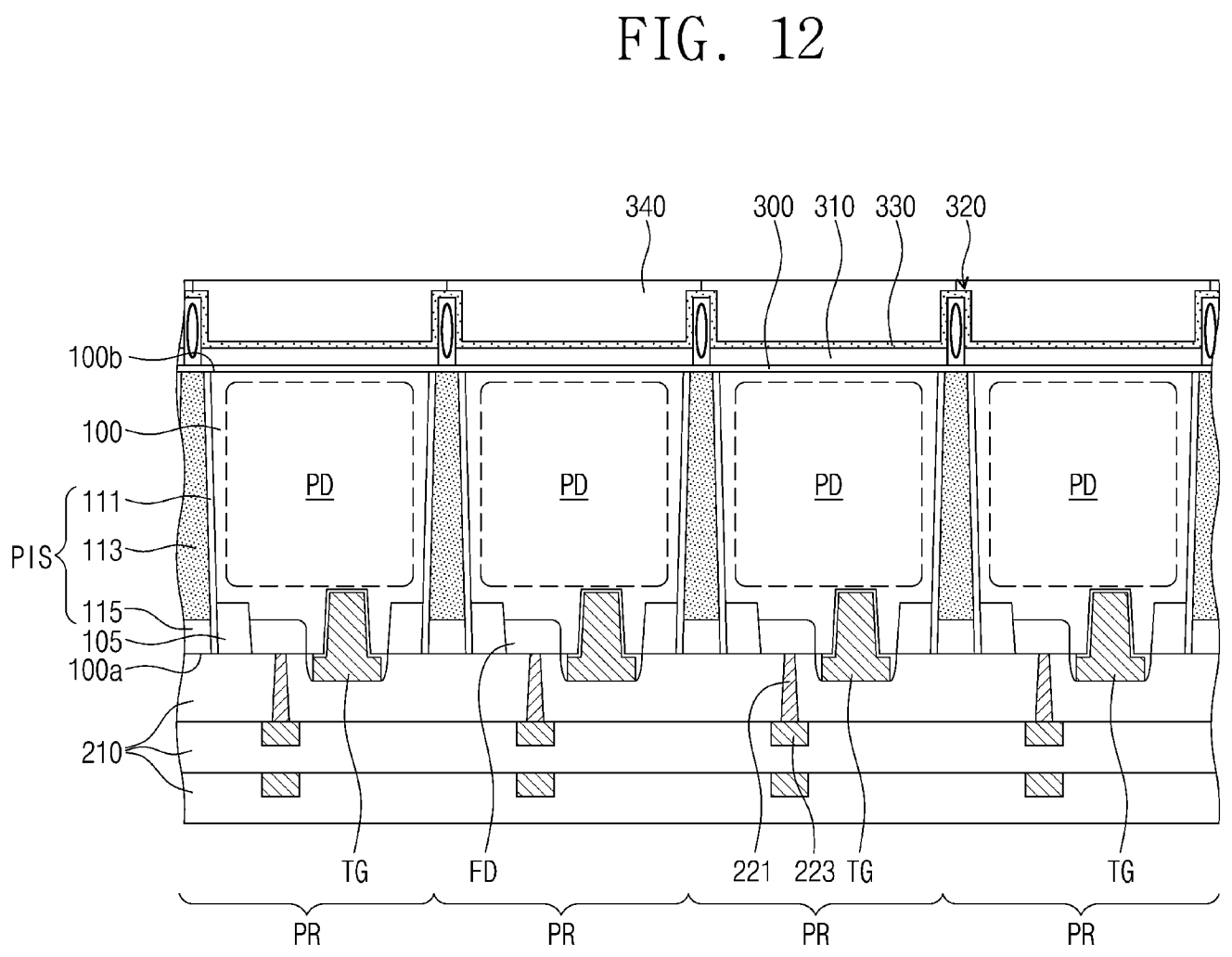

Referring to FIGS. 3 and 12, the color filters 340 may be sequentially formed in corresponding ones of the pixel regions PR. Each of the color filters 340 may fill an empty space defined by the fence structure 320.

The color filters 340 may be formed by repeating a spin coating process and a patterning process several times. For example, the formation of the color filters 340 may include sequentially performing a process of coating a photoresist composition containing dye or pigment, a soil bake process, an exposure process, and a developing process. As an example, the first color filters may be respectively formed in the first pixel regions, and then, the second color filters may be respectively formed in the second pixel regions. In addition, after the formation of the second color filters, the third color filters may be formed in the third pixel regions.

Thereafter, as shown in FIGS. 3 and 4, the micro lenses 350 may be formed to correspond to the pixel regions PR, respectively.

The formation of the micro lenses 350 may include forming a photoresist layer having an optically-transparent property, patterning the photoresist layer to form photoresist patterns corresponding to the pixel regions PR, respectively, and reflowing the photoresist patterns. Thus, the micro lenses 350 may be formed to have a specific curvature and an upward convex shape. In an embodiment of the inventive concept, during the formation of the micro lenses 350, a planarization portion having a uniform thickness may be formed below the micro lenses 350. The micro lenses 350 may have a substantially uniform curvature, on the top surfaces of the color filters 340.

Thereafter, the passivation layer 360 may be formed to conformally cover the micro lenses 350. The passivation layer 360 may be formed of or include at least one of, for example, inorganic oxide materials.

FIGS. 13A to 13E are sectional views corresponding to illustrating the portion 'A' of FIG. 4 and illustrating a method of forming a fence structure of an image sensor, according to an embodiment of the inventive concept.

Figure 13A:
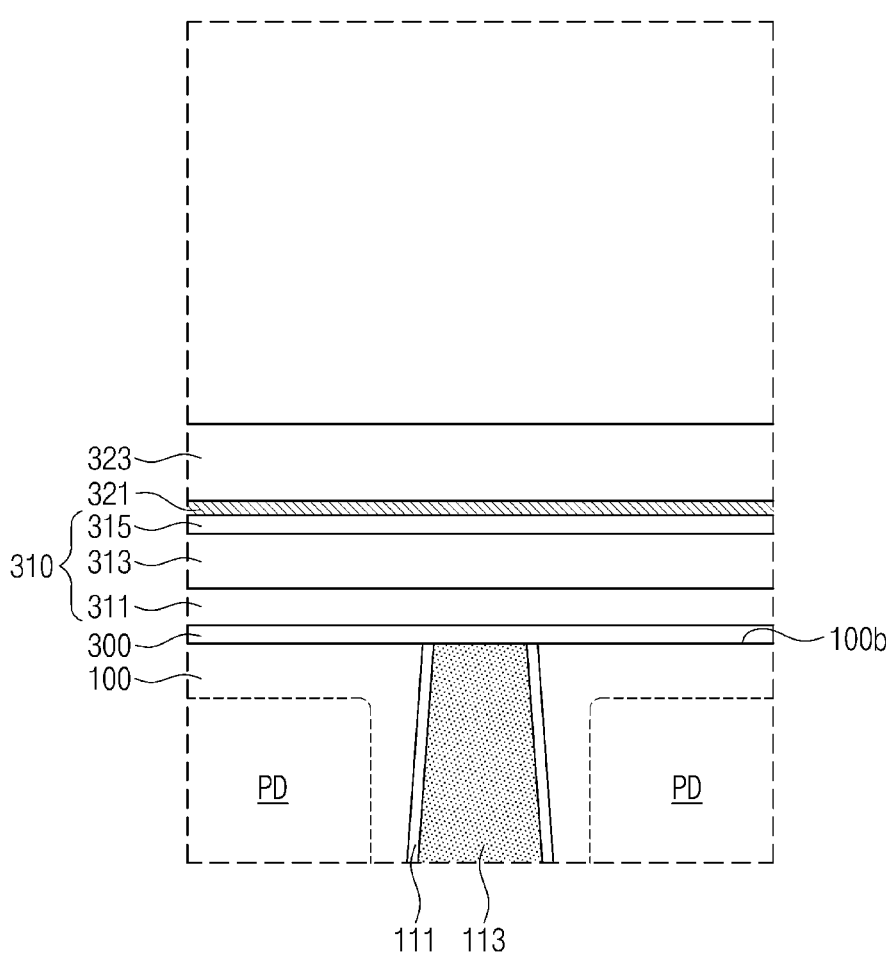
FIGS. 13A, 13B, 13C, 13D and 13E are sectional views corresponding to the portion 'A' of FIG. 4 and illustrating a method of forming a fence structure of an image sensor, according to an embodiment of the inventive concept.

Referring to FIG. 13A in conjunction with FIG. 11, the anti-reflection layer 310 may be formed on the fixed charge layer 300.

The anti-reflection layer 310 may be formed by sequentially slacking the first insulating layer 311, the second insulating layer 313, and the third insulating layer 315. The first to third insulating layers 311, 313, and 315 may be formed of or include at least one of transparent insulating materials. The first to third insulating layers 311, 313, and 315 may have different refractive indices from each other. The thicknesses of the first to third insulating layers 311, 313, and 315 may be variously adjusted to realize high transmittance of the anti-reflection layer 310. Each of the first to third insulating layers 311, 313, and 315 may be formed by a chemical vapor deposition process or an atomic layer deposition process.

As an example, the first insulating layer 311 may be thicker than the fixed charge layer 300. The second insulating layer 313 may be thicker than the first insulating layer 311. The third insulating layer 315 may be thinner than the second insulating layer 313. The first insulating layer 311 may be deposited to have a thickness of about 600 Å to 700 Å. The second insulating layer 313 may be deposited to have a thickness of about 650 Å to about 750 Å. The third insulating layer 315 may be deposited to have a thickness of about 70 Å to about 150 Å.

The first insulating layer 311 may be formed of a material different from the fixed charge layer 300. The first and third insulating layers 311 and 315 may have the same refractive index, and the second insulating layer 313 may have a refractive index different from the first and third insulating layers 311 and 315.

As an example, the fixed charge layer 300 may be formed of or include aluminum oxide, the first and third insulating layers 311 and 315 may be formed of or include at least one of metal oxide materials (e.g., hafnium oxide), and the second insulating layer 313 may be formed of or include silicon oxide.

Next, a barrier layer 321 and a first fence layer 323 may be sequentially formed on the anti-reflection layer 310.

The barrier layer 321 may be formed of or include at least one of metallic materials (e.g., titanium, tantalum, or tungsten). The barrier layer 321 may be deposited to have a thickness of about 70 Å to about 150 Å.

The first fence layer 323 may be formed of or include a silicon-containing material. The silicon-containing material may include a silicon oxide material (e.g., tetraethyl orthosilicate (TEOS)). The first fence layer 323 may be formed by, for example, a plasma-enhanced chemical vapor deposition (PE-CVD) method, but the inventive concept is not limited to this example. The first fence layer 323 may be deposited to be thicker than the barrier layer 321. The first fence layer 323 may be deposited to have a thickness of about 500 Å to about 700 Å.

Figure 13B:
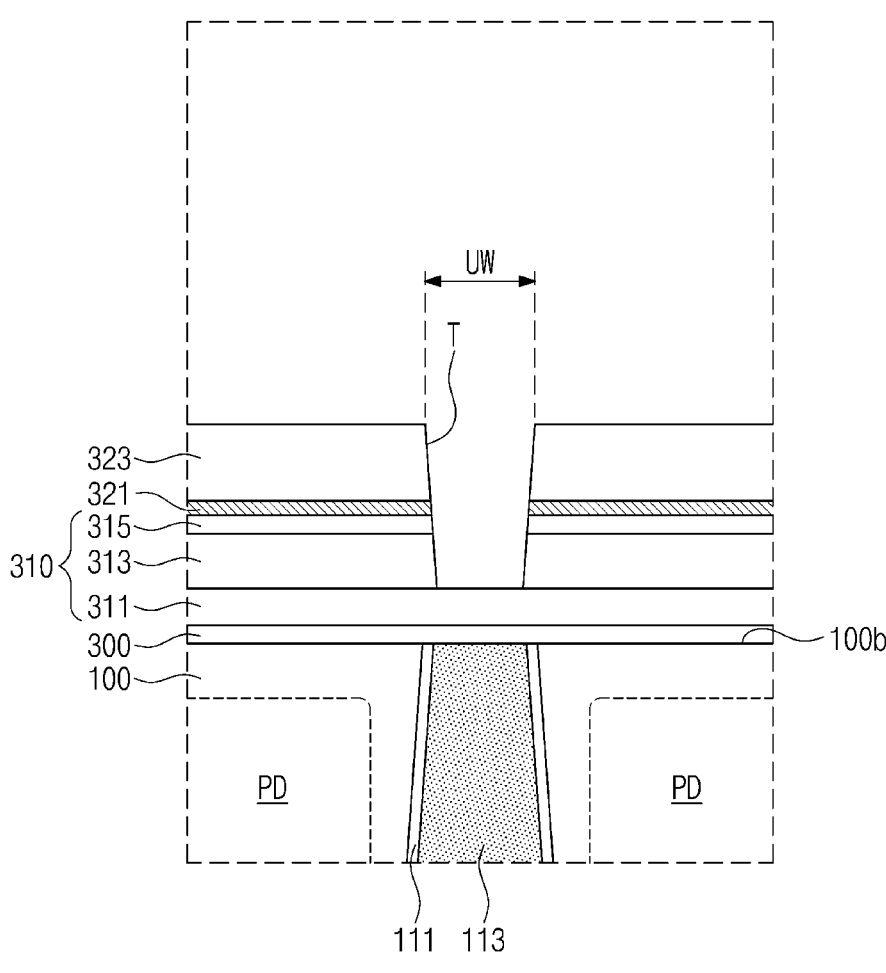

Referring to FIG. 13B, a trench T may be formed by patterning the first fence layer 323, the barrier layer 321, and the anti-reflection layer 310. The bottom of the trench T may expose the first insulating layer 311.

The trench T may include a plurality of first regions, which are extended in the first direction D1, and a plurality of second regions, which are extended in the second direction D2 crossing the first direction D1. The trench T may have a grid or lattice shape. The trench T may be overlapped with the pixel isolation structure PIS, when viewed in a plan view.

The formation of the trench T may include forming a mask pattern on the first fence layer 323 and sequentially and anisotropically etching the first fence layer 323, the barrier layer 321, the second and third insulating layers 313 and 315 using the mask pattern as an etch mask. The trench T may expose the top surface of the first insulating layer 311. The trench T may have a gradually decreasing width in a downward direction. In other words, the trench T may have an inclined side surface. In an embodiment of the inventive concept, an upper width UW of the trench T may be larger than the smallest width (e.g., W1 of FIG. 5A) of the fence structure 320. The upper width UW of the trench T may be greater than the width of the exposed surface of the first insulating layer 311.

Figure 13C:
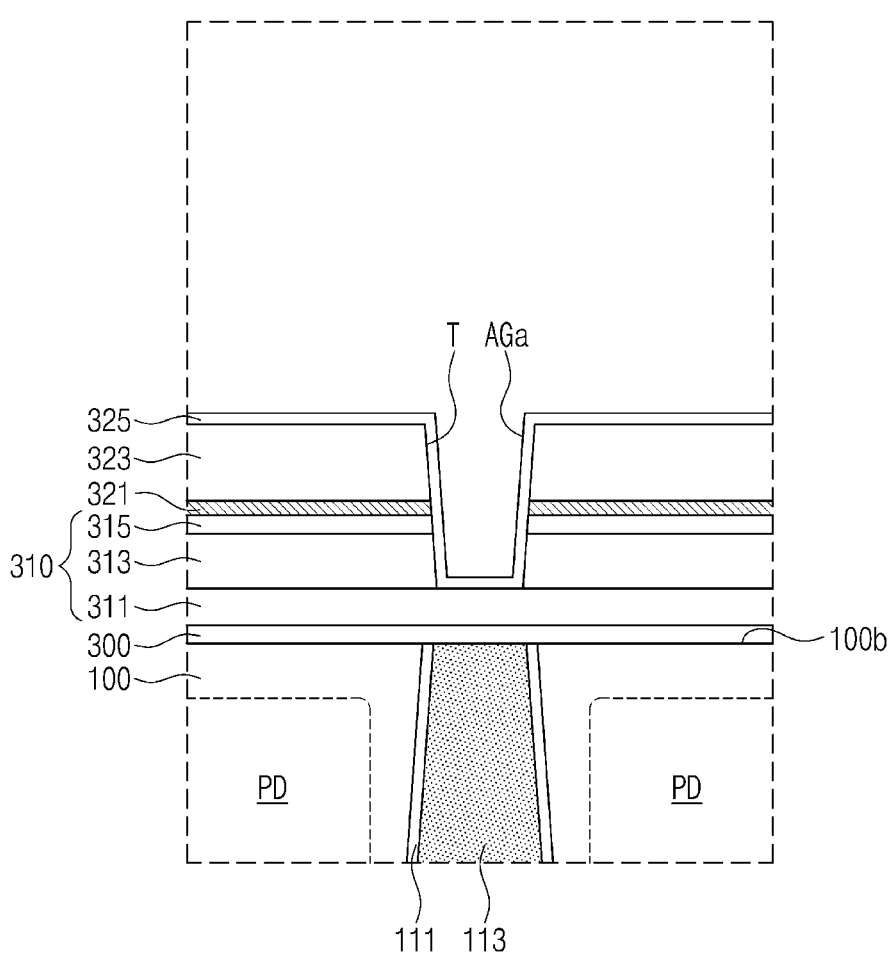

Referring to FIG. 13C, a second fence layer 325 may be formed to cover an inner surface of the trench T. The second fence layer 325 may be deposited to conformally cover the inner surface of the trench T and a top surface of the first fence layer 323. The second fence layer 325 may define the lower gap region AGa in the trench T.

The second fence layer 325 may be deposited by a deposition method having a good step-coverage property. The second fence layer 325 may be formed by an atomic layer deposition process. A deposition thickness of the second fence layer 325 may be smaller than half the width of the trench T. The second fence layer 325 may be deposited to have a thickness of about 70 Å to about 150 Å.

The second fence layer 325 may be formed of or include at least one of silicon oxide, silicon nitride, and/or silicon oxynitride. As an example, the second fence layer 325 may be formed of or include the same material as the first fence layer 323. For example, the second fence layer 325 may be formed of or include a silicon oxide material (e.g., tetraethyl orthosilicate (TEOS)).

Figure 13D:
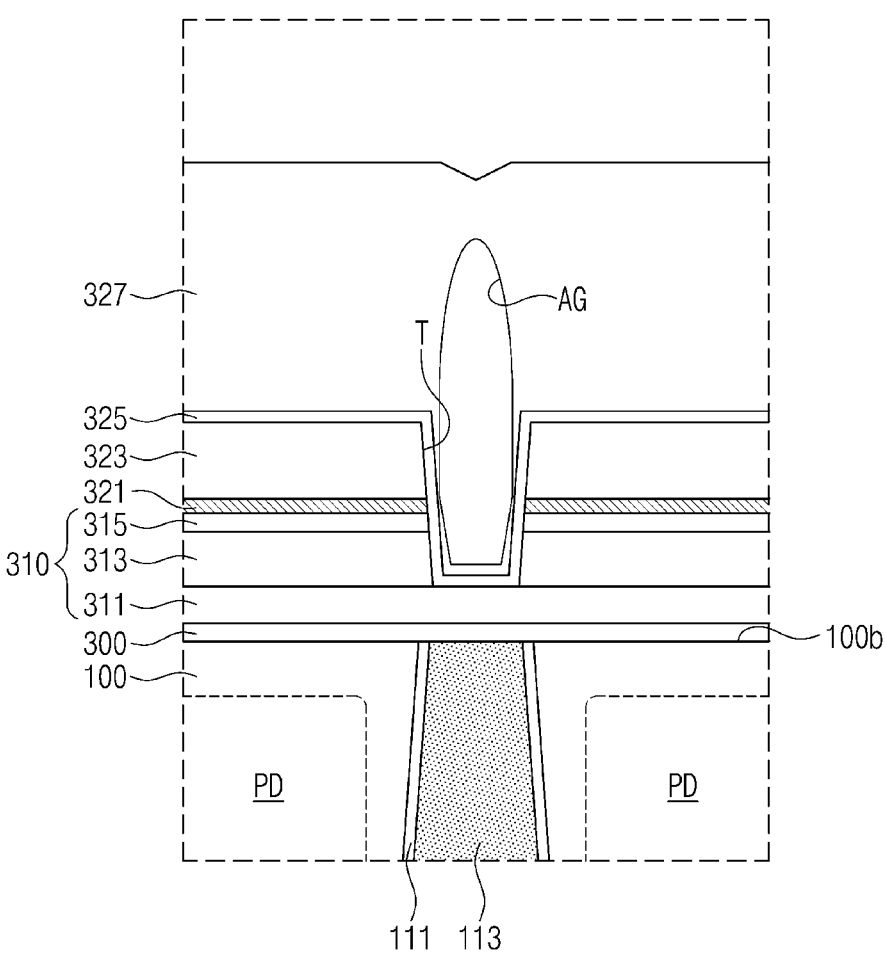

Referring to FIG. 13D, a third fence layer 327 may be formed on the second fence layer 325 to define the upper gap region AGb. The third fence layer 327 may be formed using a deposition method having a poor step coverage property. In this case, due to an over-hang phenomenon of the third fence layer 327, the air gap AG region may be formed. In addition, when the third fence layer 327 is deposited, the third fence layer 327 may have a non-flat top surface on the lower gap region AGa. For example, the top surface of the third fence layer 327 may sink where the air gap AG is located. The upper gap region AGb of the third fence layer 327 may be connected to the lower gap region AGa defined by the second fence layer 325. Alternatively, referring to FIG. 6A, the air gap AG may be formed by forming the third fence layer 327 to partially fill the lower gap region AGa of the second fence layer 325.

The third fence layer 327 may be formed of or include at least one of silicon oxide, silicon nitride, and/or silicon oxynitride. The third fence layer 327 may be formed of an organic material whose refractive index is lower than the color filters. As an example, the third fence layer 327 may be formed of or include the same material as the second fence layer 325. For example, the third fence layer 327 may be formed of or include a silicon oxide material (e.g., tetraethyl orthosilicate (TEOS)).

Figure 13E:
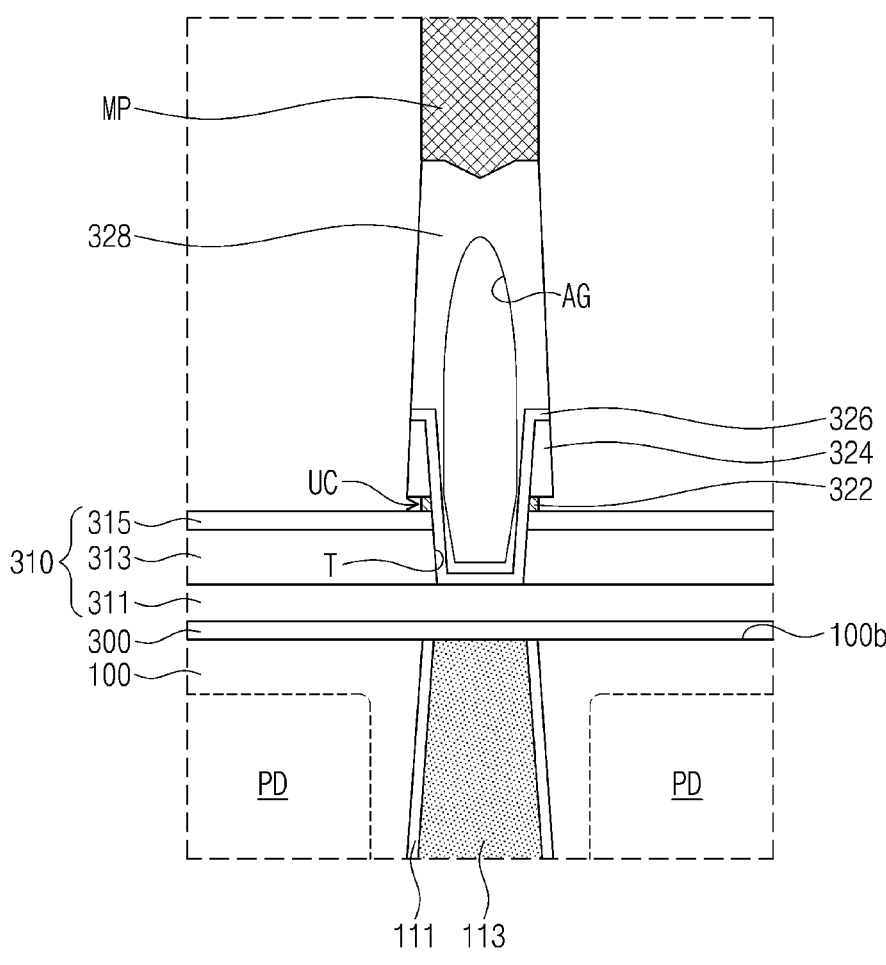

Referring to FIG. 13E, a mask patient MP may be formed on the third fence layer 327. The mask pattern MP may be formed of or include a photoresist material.

The third fence layer 327, the second fence layer 325, the first fence layer 323, and the barrier layer 321 may be sequentially patterned using the mask patient MP. Accordingly, the fence structure 320 may be formed on the anti-reflection layer 310.

For example, an anisotropic etching process using the mask pattern MP may be performed on the third fence layer 327, the second fence layer 325, and the first fence layer 323, and in this anisotropic etching process, the barrier layer 321 may be used as an etch stop layer. As a result, the first fence pattern 324, the second fence pattern 326, and the third fence pattern 328 may be sequentially formed.

In the case where the anisotropic etching process is performed in an over-etching manner, the barrier layer 321 may be etched to form the barrier patterns 322, and the top surface of the anti-reflection layer 310 may be exposed to the outside.

An etch recipe in the etching process on the barrier layer 321 may be adjusted to etch the side surface of the barrier layer 321 in an over-etching manner, and in this case, the side surfaces of the barrier patterns 322 may be laterally recessed relative to the side surfaces of the first, second, and third fence patterns 324, 326, and 328. Accordingly, the undercut regions UC may be formed to expose the side surfaces of the barrier patterns 322 between the top surface of the anti-reflection layer 310 and the bottom surface of the first fence pattern 324.

When the patterning process using the mask pattern MP is performed, the mask pattern MP may be misaligned from the lower gap region AGa of the second fence layer 325, and in this case, the undercut regions UC may be formed to have an asymmetric shape, as shown in FIG. 6D.

Even when there is a misalignment in the process of patterning the third fence layer 327 and the barrier patterns 322 are removed, it is possible to prevent the air gap AG from being broken or burst, because the lower gap region AGa is enclosed by the second fence pattern 326.

Figure 14:
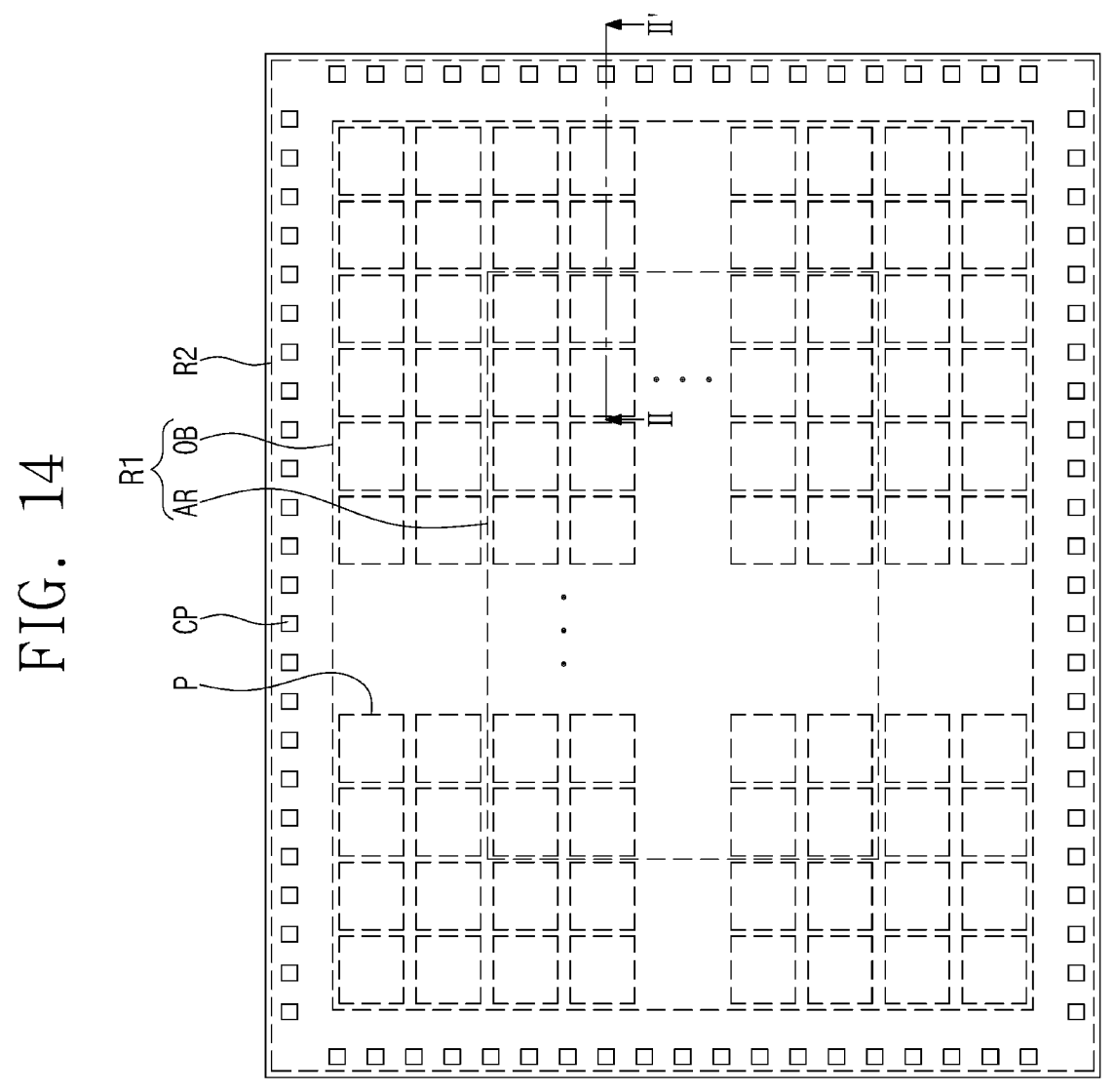
Figure 15:
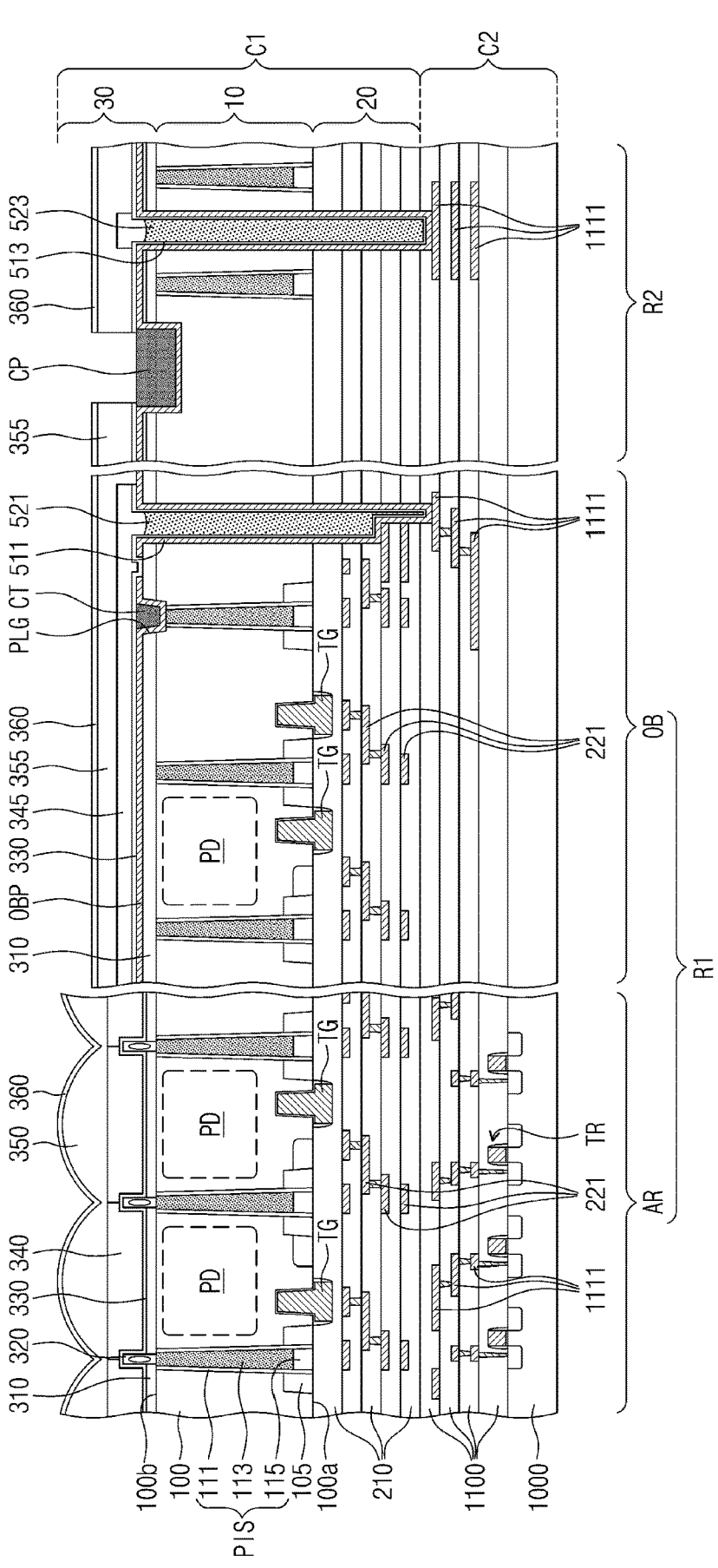
FIGS. 15 and 16 are sectional views, which are taken along a line II-II' of FIG. 14 to illustrate an image sensor according to an embodiment of the inventive concept.
Figure 16:
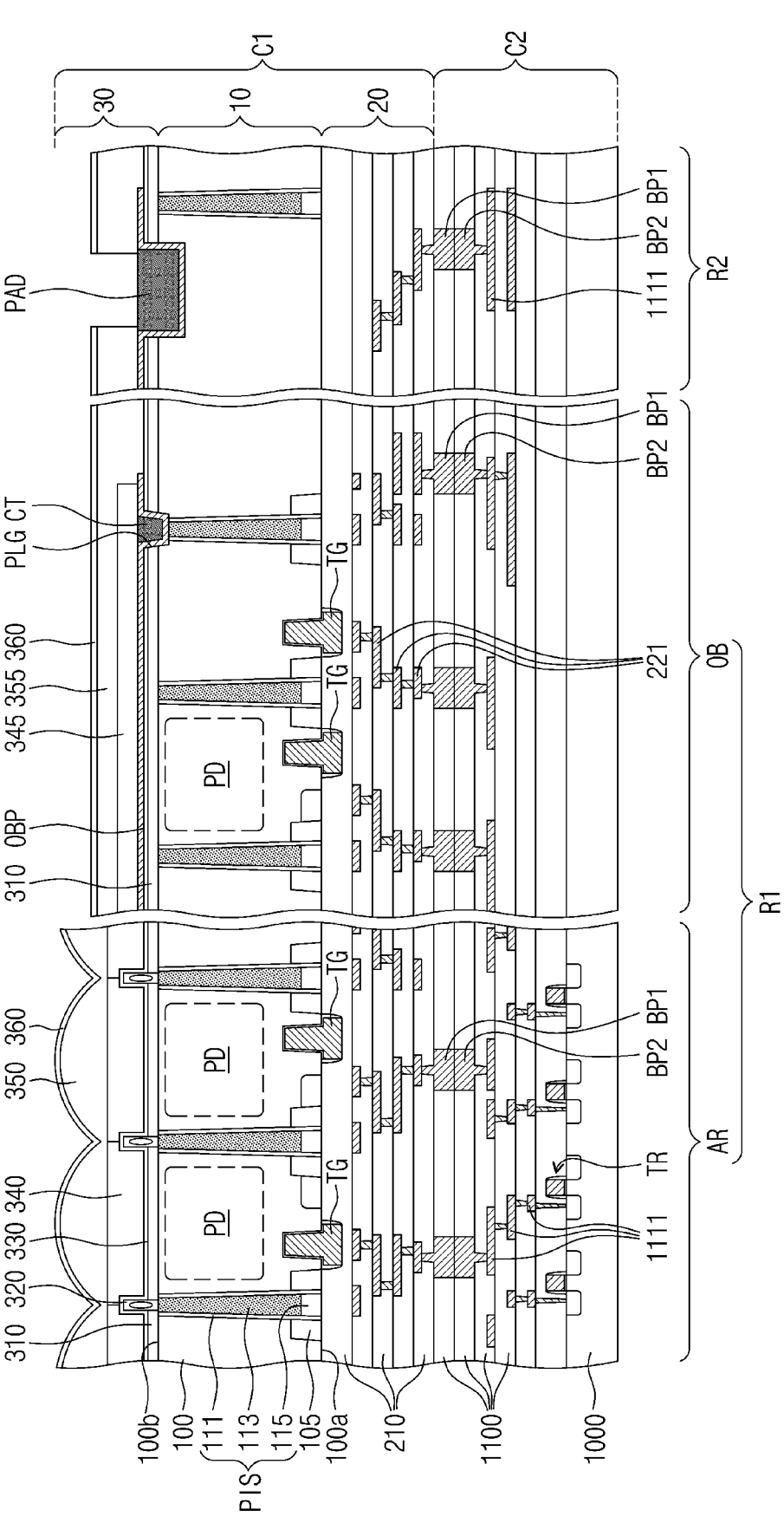

FIG. 14 is a schematic plan view illustrating an image sensor including a semiconductor device according to an embodiment of the inventive concept. FIGS. 15 and 16 are sectional views, which are taken along a line II-II' of FIG. 14 to illustrate an image sensor according to an embodiment of the inventive concept.

Referring to FIGS. 14 and 15, the image sensor may include a sensor chip C1 and a logic chip C2. The sensor chip C1 may include a pixel array region R1 and a pad region R2.

The pixel array region R1 may include a plurality of unit pixels P, which are two-dimensionally arranged in two different directions (e.g., in the first and second directions D1 and D2). Each of the unit pixels P may include a photoelectric conversion device and readout devices. An electrical signal, which is generated by an incident light, may be output from each of the unit pixels P of the pixel array region R1.

The pixel array region R1 may include a light-receiving region AR and a light-blocking region OB. The light-blocking region OB may enclose the light-receiving region AR, when viewed in a plan view. For example, the light-blocking region OB may enclose the light-receiving region AR in four different directions (e.g., up, down, left, and rights directions), when viewed in a plan view. In an embodiment of the inventive concept, reference pixels, to which light is not incident, may be provided in the light-blocking region OB, and in this case, by comparing a charge amount, which is obtained from the unit pixel P in the light-receiving region AR, with an amount of charges generated in the reference pixels, it is possible to calculate a magnitude of an electrical signal sensed from the unit pixel P.

A plurality of conductive pads CP, which are used to input or output control signals and photoelectric signals, may be disposed in the pad region R2. The pad region R2 may enclose the pixel array region R1, when viewed in a plan view, and in this case, it is possible to facilitate an electric connection between the image sensor and an external device. The conductive pads CP may be used to transmit electrical signals, which are generated in the unit pixels P, to an external device.

In the light-receiving region AR, the sensor chip C1 may be configured to have the same technical features as the image sensor described above. In other words, when viewed in the vertical direction, the sensor chip C1 may include the readout circuit layer 20, the optically-transparent layer 30, and the photoelectric conversion layer 10 therebetween, as described above. The photoelectric conversion layer 10 of the sensor chip C1 may include the semiconductor substrate 100, the pixel isolation structure PIS defining pixel regions, and the photoelectric conversion regions PD provided in the pixel regions, as described above. The pixel isolation structure PIS may have substantially the same structure on the light-receiving region AR and the light-blocking region OB.

The optically-transparent layer 30 may include a light-blocking pattern OBP, a back-side contact plug PLG, a contact pattern CT, an organic layer 355, and the passivation layer 360, which are provided in the light-blocking region OB. A portion of the pixel isolation structure PIS may be connected to the back-side contact plug PLG, in the light-blocking region OB.

For example, the semiconductor pattern 113 may be connected to the back-side contact plug PLG, in the light-blocking region OB. The semiconductor pattern 113 may directly contact the back-side contact plug PLG, in the light-blocking region OB. The back-side contact plug PLG may have a width that is larger than a width of the pixel isolation structure PIS. The back-side contact plug PLG may be formed of or include at least one of metallic materials and/or metal nitride materials. For example, the back-side contact plug PLG may be formed of or include at least one of titanium and/or titanium nitride.

The contact pattern CT may be buried in a contact hole, in which the back-side contact plug PLG is formed. The contact pattern CT may include a material that is different from the back-side contact plug PLG. For example, the contact pattern CT may be formed of or include aluminum (Al).

The contact pattern CT and the back-side contact plug PLG may be electrically connected to the semiconductor pattern 113 of the pixel isolation structure PIS. A negative bias may be applied to the semiconductor pattern 113 of the pixel isolation structure PIS through the contact pattern CT, and the negative bias may be delivered from the light-blocking region OB to the light-receiving region AR. Accordingly, it is possible to reduce a dark current which may be generated at an interface between the pixel isolation structure PIS and the semiconductor substrate 100.

In the light-blocking region OB, the light-blocking patient OBP may be continuously extended from the back-side contact plug PLG and may be disposed on the top surface of the anti-reflection layer 310. In other words, the light-blocking pattern OBP may be formed of or include the same material as the back-side contact plug PLG. The light-blocking pattern OBP may be formed of or include at least one of metallic materials and/or metal nitride materials. For example, the light-blocking pattern OBP may be formed of or include at least one of titanium and/or titanium nitride. The light-blocking pattern OBP may not be extended to the light-receiving region AR of the pixel array region R1.

The light-blocking pattern OBP may prevent light from being incident into the photoelectric conversion regions PD, which are provided on the light-blocking region OB. The photoelectric conversion regions PD in the reference pixels of the light-blocking region OB may be configured to output a noise signal, not a photoelectric signal. The noise signal may be produced by electrons, which are generated by heat or a dark current.

The protection layer 330 may be extended from the pixel array region R1 to the pad region R2. The protection layer 330 may cover a top surface of the light-blocking pattern OBP.

A filter layer 345 may be provided on the light-blocking region OB to cover the protection layer 330. The filter layer 345 may be configured to block light whose wavelength is different front that by the color filters 340. For example, the filter layer 345 may block infrared light. In an embodiment of the inventive concept, the filter layer 345 may include a blue color filter, but the inventive concept is not limited to this example.

The organic layer 355 and the passivation layer 360 may be provided on the protection layer 330 and in the light-blocking region OB and the pad region R2. The organic layer 355 may be formed of or include the same material as the micro lenses 350.

A first penetration conductive pattern 511 may be provided in the light-blocking region OB to penetrate the semiconductor substrate 100 and may be electrically connected to the metal line 223 of the readout circuit layer 20 and an interconnection structure 1111 of the logic chip C2. The first penetration conductive pattern 511 may have a first bottom surface and a second bottom surface, which are located at different levels. For example, one of the bottom surfaces of the first penetration conductive pattern 511 may be protrude to the logic chip C2. A first gapfill pattern 521 may be provided in the first penetration conductive pattern 511. The first gap till pattern 521 may be formed of or include at least one of low refractive materials and may have an insulating property.

The conductive pads CP may be disposed in portions of the semiconductor substrate 100 which are located in the pad region R2 and adjacent to the second surface 100b. The conductive pads CP may be buried in portions of the semiconductor substrate 100 located near the second surface 100b. In an embodiment of the inventive concept, the conductive pads CP may be provided in pad trenches, which are formed in the second surface 100b of the semiconductor substrate 100 and are located in the pad region R2. The conductive pads CP may be formed of or include at least one of metallic materials (e.g., aluminum, copper, tungsten, titanium, tantalum, or alloys thereof). In a mounting process of an image sensor, bonding wires may be bonded to the conductive pads CP. The conductive pads CP may be electrically connected to an external device through bonding wires.

A second penetration conductive pattern 513 may be provided in the pad region R2 to penetrate the semiconductor substrate 100 and may be electrically connected to the interconnection structure 1111 of the logic chip C2. The bottom surface of the second penetration conductive pattern 513 may be at the same level as the lowermost bottom surface of the first penetration conductive pattern 511. The second penetration conductive pattern 513 may be extended to a region on the second surface 100b of the semiconductor substrate 100 and may be electrically connected to the conductive pad CP. A portion of the second penetration conductive pattern 513 may cover bottom and side surfaces of the conductive pads CP. A second gapfill pattern 523 may be provided in the second penetration conductive pattern 513. The second gapfill pattern 523 may be formed of or include at least one of low refractive materials and may have an insulating property. In the pad region R2, the pixel isolation structures PIS may be provided around the second penetration conductive pattern 513.

The logic chip C2 may include a logic semiconductor substrate 1000, logic circuits (TR), the interconnection structures 1111 connected to the logic circuits, and logic interlayer insulating layers 1100. The uppermost layer of the logic interlayer insulating layers 1100 may be coupled to the readout circuit layer 20 of the sensor chip C1. The logic chip C2 may be electrically connected to the sensor chip C1 through the first and second penetration conductive patterns 511 and 513.

In an embodiment of the inventive concept, the sensor and logic chips C1 and C2 are illustrated to be electrically connected to each other through the first and second penetration conductive patterns 511 and 513, but the inventive concept is not limited to this example.

In the embodiment shown in FIG. 16, the first and second penetration conductive patterns of FIG. 15 may be omitted, and the sensor and logic chips C1 and C2 may be electrically connected to each other by directly connecting bonding pads, which are respectively provided in the uppermost metal layers of the sensor and logic chips C1 and C2, to each other.

For example, the sensor chip C1 of the image sensor may include first bonding pads BP1, which are provided in the uppermost metal layer of the readout circuit layer 20, and the logic chip C2 may include second bonding pads BP2, which are provided in the uppermost metal layer of the interconnection structure 1111. The first and second bonding pads BP1 and BP2 may be formed of or include at least one of, for example, tungsten (W), aluminum (Al), copper (Cu), tungsten nitride (WN), tantalum nitride (TaN), or titanium nitride (TiN).

The first bonding pads BP1 of the sensor chip C1 and the second bonding pads BP2 of the logic chip C2 may be directly and electrically connected to each other in a hybrid bonding manner. Here, the hybrid bonding manner may be a bonding manner of fusing two elements, which contain the same kind of material, into a single element at an interface therebetween. For example, in the case where the first and second bonding pads BP1 and BP2 are formed of copper (Cu), they may be physically and electrically connected to each other in a Cu—Cu bonding manner. In addition, insulating layers of the sensor and logic chips C1 and C2 may be bonded to each other in a dielectric-dielectric bonding manner.

According to an embodiment of the inventive concept, a fence structure may include an air gap, allowing light, which is inclinedly incident into each pixel region, to be less refracted by the fence structure. Accordingly, it is possible to increase an amount of light that is incident into a photoelectric conversion region.

The air gap of the fence structure may be provided to have a portion that is located below a top surface of an anti-reflection layer, and this make it possible to more effectively reduce a cross-talk between adjacent ones of pixel regions. In other words, light-receiving efficiency in each photoelectric conversion region may be increased, and thus, a signal-to-noise ratio (SNR) property may be improved.

In addition, by minimizing a size of a barrier pattern, which may be present on a portion of a side surface of the fence structure, it is possible to minimize a reduction of sensitivity caused by the barrier pattern.

Furthermore, since the barrier patterns are located at both sides of a second fence pattern defining a lower gap region of the air gap, it is possible to prevent the air gap from being broken or burst when side surfaces of the barrier patterns are recessed in a process of forming the fence structure.

While example embodiments of the inventive concept have been particularly show n and described, it will be understood by one of ordinary skill in the art that variations in form and detail may be made thereto without departing from the spirit and scope of the inventive concept as set forth in the attached claims.

What is claimed is:

1. An image sensor, comprising:
a semiconductor substrate including a plurality of pixel regions;
an anti-reflection layer on the semiconductor substrate;
color filters provided on the anti-reflection layer and in the pixel regions; and
a fence structure disposed between adjacent ones of the color filters,
wherein the fence structure comprises:
a lower portion penetrating the anti-reflection layer;
an upper portion on the anti-reflection layer; and
an intermediate portion between the lower portion and the upper portion,
wherein the fence structure has undercut regions, which are provided at both sides of the intermediate portion and are between the upper portion of the fence structure and a top surface of the anti-reflection layer, and
wherein a side wall of the fence structure includes a stepped portion, in which the undercut regions are defined.

2. The image sensor of claim 1, wherein the fence structure has an air gap including a lower gap region, which is located in the lower portion of the fence structure, and an upper gap region, which is located in the upper portion of the fence structure and is connected to the lower gap region.

3. The image sensor of claim 1, wherein the upper portion of the fence structure has a decreasing width as a distance from the top surface of the anti-reflection layer increases, and
the lower portion of the fence structure has a decreasing width as the lower portion gets closer to a bottom surface of the anti-reflection layer.

4. The image sensor of claim 1, wherein the undercut regions are asymmetric with respect to each other.

5. The image sensor of claim 1, wherein a top surface of the fence structure is not flat.

6. The image sensor of claim 1, wherein the fence structure comprises:
a first fence pattern penetrating a portion of the anti-reflection layer and defining a lower gap region;
a second fence pattern disposed on the first fence pattern to define an upper gap region connected to the lower gap region; and
a barrier pattern disposed on the top surface of the anti-reflection layer and on at least one of opposite side surfaces of the first fence pattern,
wherein a side surface of the barrier pattern defines at least one of the undercut regions.

7. The image sensor of claim 6, wherein the undercut regions comprise:
a firsts undercut region, which is formed at a first side of the fence structure to expose the side surface of the barrier pattern; and
a second undercut region, which is formed at a second side of the fence structure to expose a portion of a side surface of the first fence pattern.

8. The image sensor of claim 6, wherein the first fence pattern covers an inner surface of a trench, which penetrates a portion of the anti-reflection layer.

9. The image sensor of claim 6, wherein the first and second fence patterns comprise silicon oxide, and
the barrier pattern comprises a metallic material.

10. The image sensor of claim 1, wherein the anti-reflection layer comprises a first insulating layer, a second insulating layer, and a third insulating layer which are sequentially stacked, and
the lower portion of the fence structure penetrates the second and third insulating layers.

11. The image sensor of claim 10, wherein the second insulating layer is thicker than the first and third insulating layers.

12. The image sensor of claim 10, wherein the first and third insulating layers comprise a metal oxide, and the second insulating layer comprises silicon oxide.

13. An image sensor, comprising:
a semiconductor substrate including a plurality of pixel regions;
an anti-reflection layer on the semiconductor substrate;

color filters provided on the anti-reflection layer and in the pixel regions; and a fence structure disposed between adjacent ones of the color filters, the fence structure comprising an air gap, wherein the fence structure comprises:

a first fence pattern provided in the anti-reflection layer to define a lower region of the air gap;

barrier patterns provided on a top surface of the anti-reflection layer to cover portions of opposite side surfaces of the first fence pattern; and a second fence pattern provided on the first fence pattern and the barrier patterns to define an upper region of the air gap, wherein the barrier patterns are provided in undercut regions.

14. The image senor of claim 13, wherein the undercut regions are asymmetric with respect to each other.

15. The image sensor of claim 13, wherein the second fence pattern has a gradually decreasing width in an upward direction, and the first fence pattern has a gradually increasing width in the upward direction.

16. The image sensor of claim 13, wherein the first and second fence patterns comprise silicon oxide, and the barrier patterns comprise a metallic material.

17. The image sensor of claim 13, further comprising third fence patterns which are provided between a portion of the first fence pattern and top surfaces of the barrier patterns.

18. The image sensor of claim 13, wherein the anti-reflection layer comprises a first insulating layer, a second insulating layer, and a third insulating layer which are sequentially stacked, and a lower portion of the first fence pattern penetrates the second and third insulating layers.

19. The image sensor of claim 18, wherein the second insulating layer comprises an insulating material different from the first and third insulating layers, and the second insulating layer is thicker than the first and third insulating layers.

20. An image sensor, comprising:

a semiconductor substrate, which has a first surface and a second surface that are opposite to each other and is of a first conductivity type, the semiconductor substrate comprising a light-receiving region, a light-blocking region, and a pad region;

a pixel isolation structure provided in the light-receiving anti light-blocking regions to define a plurality of pixel regions;

photoelectric conversion regions provided in the pixel regions;

a plurality of micro lenses disposed on the second surface of the semiconductor substrate and provided in the pixel regions;

color filters disposed between the micro lenses and the second surface of the semiconductor substrate and provided in the pixel regions;

an anti-reflection layer disposed between the color filters and the second surface of the semiconductor substrate; and a fence structure disposed between adjacent ones of the color filters, wherein the fence structure comprises:

a lower portion penetrating a portion of the anti-reflection layer;

an upper portion protruding above the anti-reflection layer; and an intermediate portion between the lower portion and the upper portion, wherein the fence structure has undercut regions, which are provided at both sides of the intermediate portion and are between the upper portion of the fence structure and a top surface of the anti-reflection layer, and wherein a side wall of the fence structure includes a stepped portion, in which the undercut regions are defined.

\* \* \* \* \*